United States Patent [19]

Sakama et al.

[11] Patent Number: 5,330,578
[45] Date of Patent: Jul. 19, 1994

[54] PLASMA TREATMENT APPARATUS

[75] Inventors: Mitsunori Sakama; Takeshi Fukada; Mitsuhiro Ichijo; Hisashi Abe, all of Kanagawa, Japan

[73] Assignee: Semiconductor Energy Laboratory Co., Ltd., Kanagawa-ken, Japan

[21] Appl. No.: 849,738

[22] Filed: Mar. 11, 1992

[30] Foreign Application Priority Data

Mar. 12, 1991 [JP] Japan .................................. 3-072470
Nov. 22, 1991 [JP] Japan .................................. 3-333922
Nov. 22, 1991 [JP] Japan .................................. 3-333923
Nov. 22, 1991 [JP] Japan .................................. 3-333925

[51] Int. Cl.⁵ .................... C23C 16/50; C23C 16/54
[52] U.S. Cl. ................................................. 118/723 R
[58] Field of Search .......................................... 118/723

[56] References Cited

U.S. PATENT DOCUMENTS 4,582,720  4/1986  Yamazaki .
4,936,251  6/1990  Yamazaki et al. .
4,979,467 12/1990  Kamaji et al. ................ 118/723 E
5,113,790  5/1992  Geisler et al. ................ 118/723 E

*Primary Examiner*—Asok Pal
*Attorney, Agent, or Firm*—Sixbey, Friedman, Leedom & Ferguson

[57] ABSTRACT

A plasma gaseous reaction apparatus including a reaction chamber, a system for supplying reaction gas to the reaction chamber and an exhaust system for exhausting unnecessary reaction products. Specifically, the apparatus includes a pair of facing electrodes disposed in the reaction chamber which are covered by shields except the area in which the electrodes face each other. The shields may include a first and second shield wherein the inner first shield is electrically insulated from the electrodes and the outer second shield is kept at earth potential. The apparatus further includes a substrate container for supporting substrates which surrounds the substrates by a frame. The outside of the substrate container is kept in the earth potential and is covered by a conductor plate electrically insulated from the container. The shields and substrate container are configured such that plasma generated by electric power supplied by the electrodes is confined in a space surrounded by the shields and the container.

7 Claims, 24 Drawing Sheets

F I G. 7
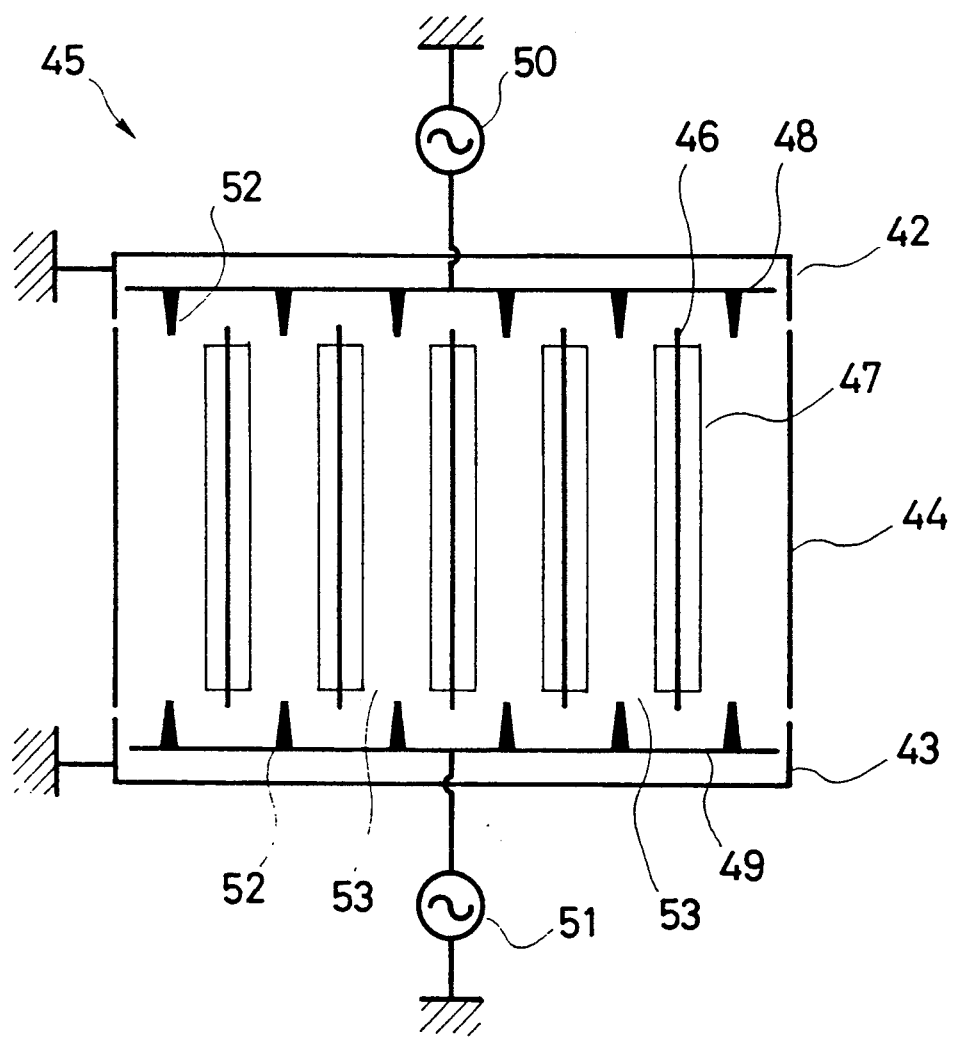

F I G. 23 (a)
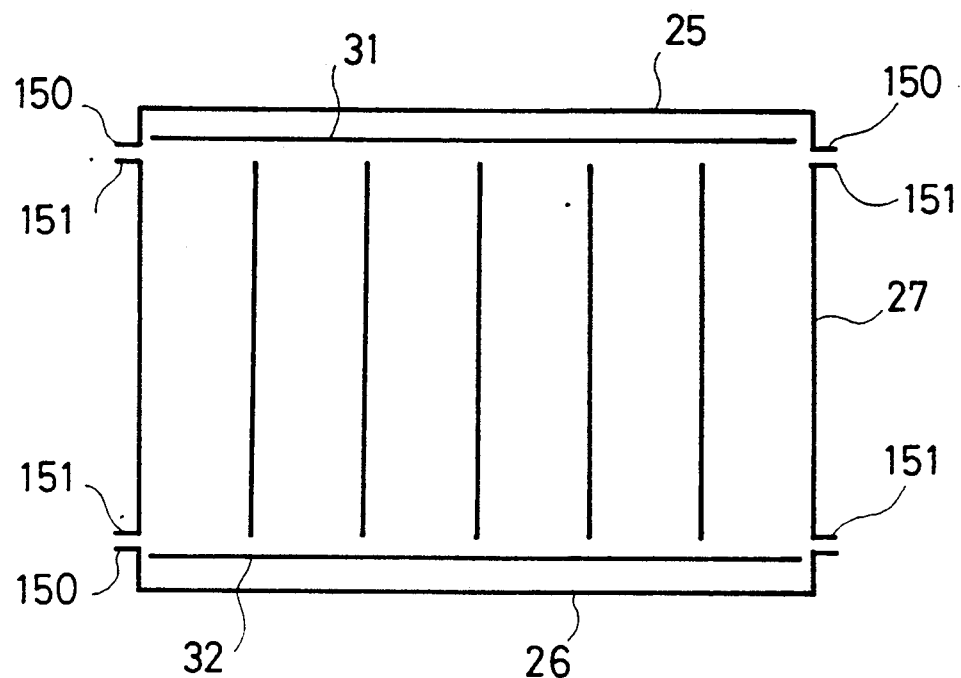
F I G. 23 (b)
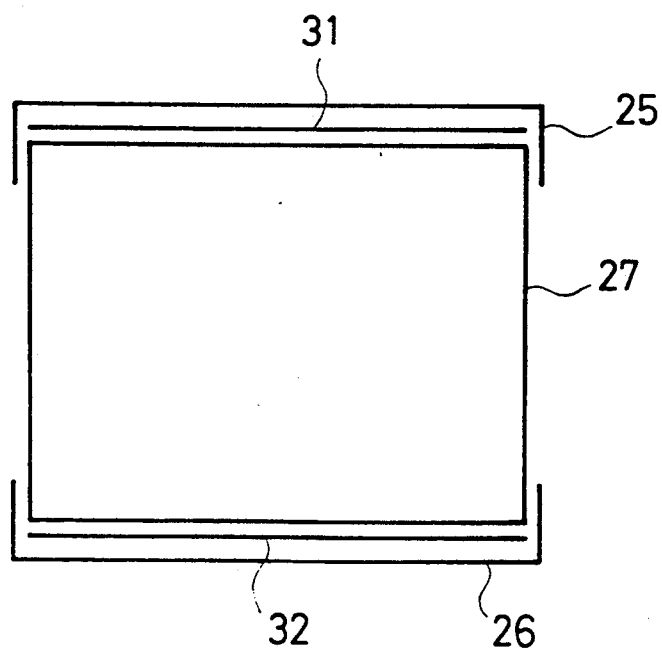

PLASMA TREATMENT APPARATUS

BACKGROUND OF THE INVENTION

The present invention relates to a positive column type plasma treatment apparatus having a novel container or substrate support (herein after referred to as "susceptor") structure.

A plasma treatment is a method for creating plasma and very active radicals by applying energy such as electromagnetic wave to a certain substance and for forming a film on a substrate by contacting the radicals to the substrate and for implementing plasma treatments such as etching and ashing of the material on the surface of the substrate. A plasma treatment apparatus refers to equipments in general for implementing those treatments.

Such a plasma treatment apparatus comprises a plasma reaction chamber which is a vacuum chamber provided with means for introducing and discharging reaction gas for producing plasma, a means for supplying energy such as electromagnetic wave for turning the original gas introduced in the plasma treating chamber into plasma state, a substrate to be treated by the plasma and its supporting means, and a heating means for warming up the substrate as necessary.

By the way, such a plasma treatment largely depends on activity of radicals and a degree of plasma treatment on the substrate to be treated is largely changed depending on a condition of plasma discharge for generating the radicals and on a distribution of density of the radicals. What is necessary in treating plasma uniformly on a large area is to select such a plasma discharge condition that generates a large amount of radicals uniformly across the large area.

As electromagnetic wave energy for turning such an reaction gas into plasma, 13.56 MHz high frequency wave, micro wave, D.C. or low frequency electromagnetic wave energy is used. Normally plasma discharge by high frequency wave is often used.

There are two types in such plasma discharge; an inductive coupling type and a capacitive coupling type. The inductive coupling type is so called a non-polar discharge. Among the capacitive coupling type plasma discharges, a plane parallel plate electrode type plasma discharge is well known. As an example of the plane parallel plate electrode type plasma treatment apparatus, a schematic drawing of a plasma CVD apparatus is shown in FIG. 1.

As seen in the figure, a pair of plane parallel plate electrodes 7 and 1 are disposed within a reaction chamber 6 and are connected to a high frequency power source 2, respectively. A substrate to be treated 3 is placed on one electrode and is heated by a heating means 4 such as a heater.

Reaction gas is introduced into the reaction chamber from a gas inlet 5, is decomposed and activated by high frequency power supplied to the electrodes a film is formed on the substrate 3. To implement plasma treatment (forming a film) uniformly, an uniform plasma discharge needs to be realized. Sometimes the electrode on which the substrate is placed is rotated to supplement the uniformity, but it has such disadvantages that it complicates the apparatus and increases the size thereof.

Moreover, the substrate is normally placed on the cathode or anode of the plane parallel plate electrode or in the cathode dark space or anode dark space which are created near them when plasma treatment is performed, so that a size of an area to be treated cannot be increased more than the size of the electrode.

Furthermore, sometimes such a phenomenon that reaction products adhere flakily on the inner wall of the reaction chamber other than the substrate occurs and the reaction products fall on the substrate when a film is formed, thereby causing a problem that pinholes are created on the thin film.

By the way, such technologies as plasma CVD and plasma etching are widely being put into practical use in manufacturing semiconductor devices and electronic parts and many equipments for mass-producing them are being proposed. Lately in particular, diameters of substrate wafers for semiconductor devices and sizes of substrates are being increased more and more. Especially an active matrix type liquid crystal electro-optic device in which thin film transistors are formed as switching elements for the liquid crystal electro-optic device is remarkably increasing in its size and it has become necessary to form a semiconductor thin film for the thin film transistors and to perform etching on a substrate with a size of 15 to 20 inches of diagonal line.

It is also desired to shorten treatment time to lower manufacturing cost and an improvement in throughput of a treatment apparatus and such an apparatus that can treat a large amount of substrates are being required.

In order to meet such requirements, sizes of plasma treatment apparatuses are being increased. For example, the size of the electrode in the apparatus as shown in FIG. 1 is increased. That is, in the case of the apparatus in FIG. 1, since the substrate is placed directly on the electrode, the simplest way for improving the treatment ability is to increase the area of the electrode. In such plane parallel plate type plasma treatment apparatus, however, the increase in the electrode size means an increase of the apparatus size, which is a problem for users who desire to treat a large substrate with a smaller apparatus taking a small floor space.

In addition to that, the increase of the electrode area hampers an uniformity of density of plasma that contacts to the surface of the substrate to be treated (discharge condition is ununiform), causing a problem that uniform plasma treatment cannot be implemented.

As a means for solving such problems, a method to dispose a plurality of plane parallel plate electrodes within a reaction chamber and to place a substrate to be treated on the electrode has been proposed, but it causes a problem of complicating the apparatus structure. Furthermore, even by this method, plasma discharge is still remained to be ununiform due to the increase of the area and uniform plasma treatment cannot be implemented.

As a means for solving such problems, an apparatus for carrying out plasma gaseous reactions has been devised (the apparatus is referred to as a positive column plasma treatment apparatus hereinafter). It has a structure in which plasma discharge is confined only in an area where substrates are placed within a reaction chamber, a frame called a container having a shape of surrounding the substrate from the four sides is disposed around the substrate to suppress the plasma from spreading to the inner wall of the reaction chamber, electrodes are separated from the substrate, parts of the frame not surrounded above and under the frame are covered by the electrodes and a space in which the substrates are placed is completely separated from the reaction chamber by the frame and the two electrodes to confine the plasma therein.

That is, the basic idea of this apparatus is to utilize a positive column area of a plasma glow discharge and to perform plasma treatment by disposing a plurality of substrates to be treated within the positive column area. A plasma CVD method utilizing this positive column is described in Japanese Patent Laid-open Nos. 59-52834 and 59-52835 which the applicant of the present invention applied.

FIG. 2 shows this method. As shown in the figure, a plurality of substrates 3 are placed between a pair of electrodes 7 and 1 by means of susceptors 10. The susceptors 10 are provided as integral parts of a container 13 and handling of the substrates is performed by inserting/taking the container to/out of a reaction chamber. To simplify its explanation, the figure only shows around a plasma discharge area. In this method, electrode shields 11 and 12 are provided around the electrodes to effectively utilize the positive column, and a reaction area is defined by the electrode shields and the peripheral wall of the container 13 to confine plasma not to discharge out of this area.

The apparatus has a structure in which the substrates are placed vertically and are surrounded by the frames, so that film may be formed on a plurality of substrates in the same time; this apparatus is an effective apparatus for solving the aforementioned problems.

However, a new problem arose also in such apparatus. In such method, in order to improve plasma treatment ability and to reduce occupied volume of the apparatus, the gaps between the substrates and the gaps between the substrate susceptors and the electrodes are narrowed down as much as possible. In the prior art method, however, the narrowed-down gaps unstabilized plasma discharge, causing the discharge to be extinguished or ununiformed and hampering uniform plasma treatment.

As well known methods for supplying discharge power to the electrodes in the positive column plasma treatment apparatus, there are following two methods as shown in FIG. 3. The method shown in FIG. 3a explains a double power source method for supplying two powers independently to each of a pair of electrodes 1 and 7 through the intermediary of matching module 9 and FIG. 3b explains a balun method for supplying one power to each of the pair of electrodes through the intermediary of the matching module 9 and balun 8.

In these power supplying methods, a blocking capacitor is inserted between the electrodes and the matching modules to apply self-bias on the substrate.

However, in the case of the positive column plasma treatment apparatus, the self-bias is not applied to the electrodes so much regardless of the existence of the blocking capacitor, even if either of the power supplying methods is adopted. Naturally no self-bias is applied when the blocking capacitor is removed.

At this time, plasma space potential is about Vpp/4 to Vpp/2 of a difference of two peak voltage values of applied power Vpp and when the container is assumed to be equal to earth potential, the container 13 receives sputtering of energy equivalent to the plasma space potential. It is the same when the substrate is conductive and is equal to the earth potential and in this case, coating films on the substrate 3 is susceptible to a large damage.

Even when the container 13 is kept in the earth potential, the surface of the substrate 3 is in a condition of being electrically insulated from the container 13 when the substrate 3 is electrically insulated from the container 13, so that the surface is turned into a condition of having a certain floating voltage. At this time, since a difference between the plasma space potential and the floating potential is smaller than that between the plasma space potential and the earth potential, the damage on the coating film is less as compare to the case when both container and substrate are kept in the earth potential.

Even in this case, however, plasma conditions change at the electrically insulated substrate and the container in the earth potential and at a boundary with the susceptors in particular because plasma near the substrates and that near the susceptors is influenced by the substrates and the susceptors, so that thickness and quality of a film differ near the edge of the substrate and at the middle part of the substrate; the uniformity of the thickness and quality of the film is impaired.

On the other hand, in the case of the positive column plasma treatment apparatus, since the container contacts partially with the reaction chamber, heat of the substrate easily escapes to the reaction chamber and heating and hot insulation cannot be easily implemented. Moreover, an impairment of uniformity of the temperature is a problem in heating a substrate in some container structures.

Furthermore, since the positive column plasma treatment apparatus can treat many substrates, a volume of plasma has to be increased and to this end, the gap between electrodes have to be widened, causing such problems that the size of the apparatus is increased and a large RF power is necessary.

Also in the case of the prior art positive column plasma treatment apparatus as shown in FIG. 2, when the substrate holding gaps and the gap between the electrodes and the susceptors are narrowed down, the susceptors and the surface of the substrates become paths for flowing current between the electrodes 7 and 1. This state is shown in FIG. 2 by a wave line 15. Due to that, even when plasma discharge has been observed in the beginning of the discharge and the plasma discharge is stopped in a state when there is no reflected power yet for inputted power, reflected power is not observed. Moreover, the plasma discharge stays only very near the upper and lower electrodes and current flows on the surface of the substrate susceptors during that, causing no plasma discharge near the substrates. Due to that, barely no inputted power is supplied to the gas, thereby hampering plasma treatment and causing an ununiform treatment.

In addition to that, in the case of the aforementioned apparatus, since there is a difference in degrees of plasma treatment on the substrate to be treated, normally a periphery of the substrate by 5 to 10% of length of the substrate size cannot be used. That is, in a case of plasma CVD apparatus for example, a coating film is formed on a substrate which is larger than what is originally needed and then its periphery is cut. Due to that, the area of the substrate has to be increased in performing plasma treatment, thereby increasing the apparatus size. The large substrate size causes an increase in material costs of the substrate and others.

Accordingly it is an object of the present invention to solve the aforementioned problems, i.e. to reduce the impairment on coating films or substrates, to improve the uniformity of thickness and quality of the coating films and to improve the substrate heating efficiency when the coating films are formed or plasma treatment is performed, by providing a plasma treatment apparatus having a novel structure that allows to treat a large substrate to be treated in a short treatment time and to perform uniform plasma treatment.

SUMMARY OF THE INVENTION

In order to attained the aforementioned goals, according to the present invention, a plasma gaseous reaction apparatus comprising a reaction chamber, a system for supplying reaction gas to the reaction chamber and a exhaust system for exhausting unnecessary reaction products has a structure in which a pair of facing electrodes disposed in the reaction chamber are covered by shields except of an area in which the electrodes face each other, the shields has a double structure consisted of an inner first shield electrically insulated from the electrodes and an outer second shield which is kept in earth potential, a substrate container for supporting substrates has a structure of surrounding the substrates by a frame except of the area in which the electrodes face, the outside of the substrate container is kept in the earth potential and is covered by a conductor plate electrically insulated from the substrate container and the pair of shields and the substrate container are provided so that plasma discharge generated by electric power supplied from the pair of electrodes is confined in a space surrounded by the pair of shields and the substrate container.

Moreover, plasma treatment is performed not in a limited area of electrode dark space but in a space of positive column area. A plurality of substrates to be treated are disposed in the plasma space to divide it into a plurality of individual plasma treatment spaces. The present invention allows to treat a large amount of substrates and those having a large area by uniforming plasma conditions in those individual treatment spaces to suppress a difference in the plasma conditions from being created in each individual space.

Furthermore, the aforementioned goals are achieved by the positive column type plasma treatment apparatus of the present invention by disposing a plurality of substrates within the container so that the plasma discharge area is apparently divided and by providing parts for causing concentration of electric field in the pair of electrode at positions which correspond to each of the divided discharge spaces.

Still more, the positive column type plasma treatment apparatus of the present invention is further structured so that a plasma discharge area is surrounded by the electrode shields and the outer wall of the container and substrate susceptors and auxiliary susceptors which form the almost the same planes with the substrate susceptors for setting a plurality of substrates are disposed with a certain interval within the discharge area.

BRIEF DESCRIPTION OF THE DRAWINGS

FIGS. 2a and 3b are diagrams illustrating methods for supplying powers used in the present invention;

FIG. 7 is a schematic drawing illustrating a part around the discharge area of the plasma treatment apparatus of the present invention;

FIGS. 23a and 23b are schematic section views illustrating a relationship between the container and the electrode shields of the present invention.

DETAILED DESCRIPTION OF PREFERRED EMBODIMENTS

Figure 1:
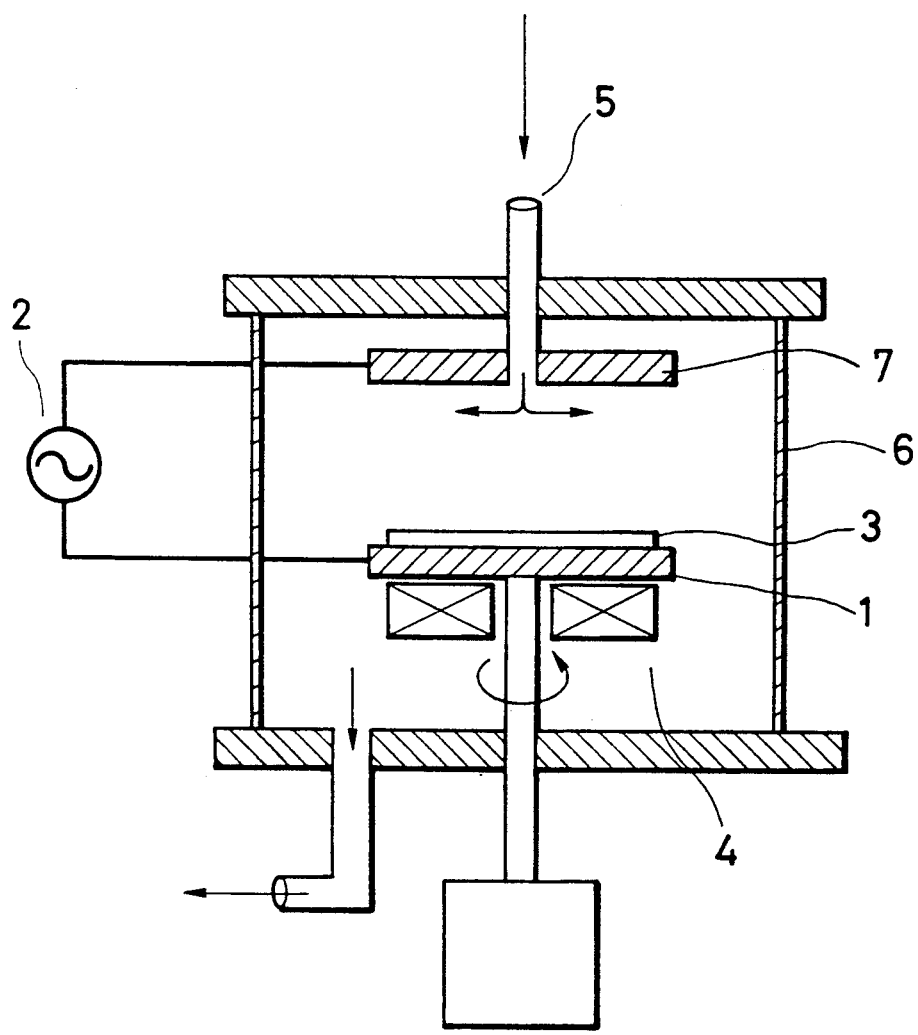
FIG. 1 is a schematic drawing of a prior art plasma treatment apparatus.

Referring now to the drawings, preferred embodiments of the present invention will be described in detail.

Figure 4:
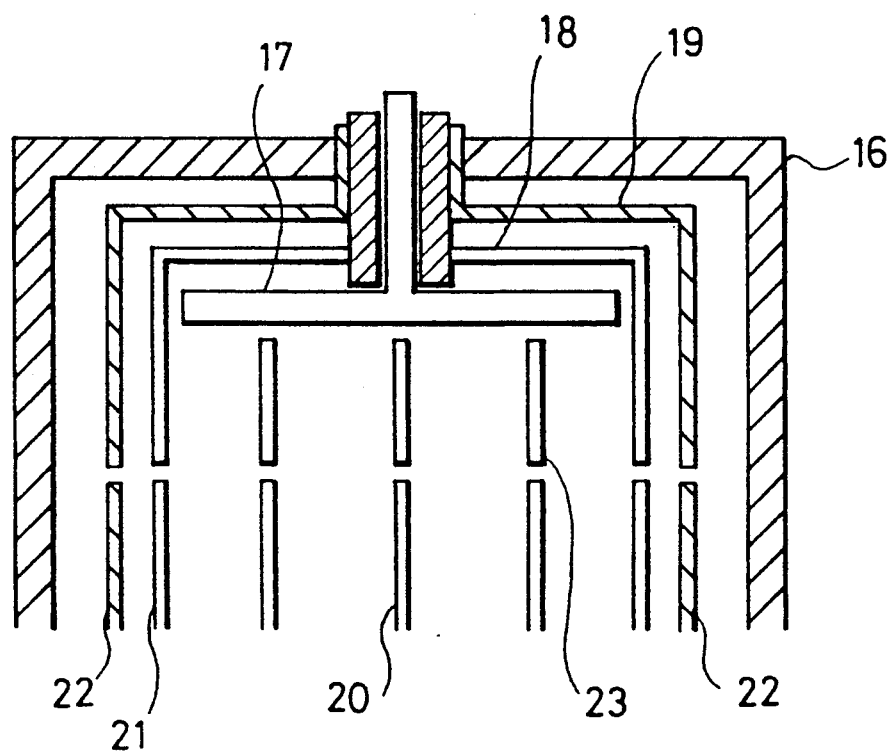
FIG. 4 is drawing illustrating a part of a plasma gaseous reaction apparatus of the present invention.

FIG. 4 shows a relationship among a reaction chamber 16, an electrode 17, a first shield 18, a second shield 19 and a substrate container 21. Although only the upper part of the reaction chamber 16 is shown in this figure, of course the electrode, the first shield, the second shield and the substrate container are provided similarly in the lower part of the reaction chamber as shown in other figures.

The reaction chamber 16 is provided with a system for supplying reaction gas, a exhaust system for exhausting unnecessary reaction products, a pressure control system for adjusting pressure to a predetermined value and a pressure measuring system for monitoring the pressure (these are not shown) and is maintained in earth potential.

Although not shown, the electrode 17 is provided as a pair facing each other and plasma generating power sources are connected to each electrode through the intermediary of matching modules or one power source is connected to them through the intermediary of a matching module and a balun.

The electrode 17 is preferably a punched or mesh plate on which a plurality of holes are created and its aperture rate is increased as much as possible within a range in which the function as a plate electrode is not impaired. It may be of course a plain plate electrode, but such punched or mesh plate is preferable. It is because the holes of the punched or mesh plate increase area of the electrode (aperture rate) as compare to area of a plane electrode. The increase in the aperture rate results in reducing current that flows in the electrode as compare to using just a plain plate electrode and thereby increases voltage, so that it brings about an effect that plasma can readily expand around the middle between the electrodes, which is advantageous in increasing a size of the apparatus.

The shield that covers the electrode is doubly structured by the first shield 18 and the second shield 19 and covers the electrode except of the area where the pair of the electrodes face each other. The first shield 18 is electrically insulated from the electrode 17 and the reaction chamber 16. The second shield 19 is fixed to the reaction chamber 16 and is electrically maintained in earth potential.

The first shield 18 and the second shield 19 may be also formed by a punched or mesh plate on which a plurality of holes are created to introduce the reaction gas in between the electrodes.

However, it is also possible to structure the first shield by different materials for a part for covering the upper part of the electrode and for a part covering the side of the electrode. For example, the part of the first shield for covering the upper part of the electrode may be of a punched or mesh shield and the part for covering the side of the electrode may be of a plate shield, so that no influence is brought about for introducing the reaction gas in between the electrode. The same is true of the second shield and the part for covering the electrode 17 may be of a punched or mesh shield and the part for covering the side of the electrode may be of a plate shield.

The first shield 18 is disposed by being separated from the electrode 17 by a gap of 1 to 10 mm for example in which no discharge is caused between them.

The first shield 18 may be made from quartz, aluminum or other metals, so long as it can keep the electrode in insulated condition from surrounding conductors. The second shield 19 may be made from a metal and others which can maintain in earth potential. The first shield 18 is supported by the second shield 19 through the intermediary of insulators made from ceramics or teflon.

The first shield 18 and the second shield 19 are separated by a gap of 1 to 10 mm for example in which no discharge cause between them.

The substrate container 21 contains the substrate susceptors 20 for supporting the substrates. The susceptors 20 are plate-like parts on whose surfaces the substrates can be placed and have a function for fixing the substrates. However, if the substrate container 21 has a function for fixing the substrates, the susceptors do not need to be plate-like.

The substrate container 21 has a structure of covering the periphery of the susceptors 20 except of the area in which the facing electrodes are provided by a frame surrounding the susceptors 20.

The substrate container 21 is covered by a conductor plate 22 which is maintained in earth potential. Since the conductor plate 22 is electrically connected with the reaction chamber 1S through the intermediary of a support, it is maintained in the earth potential.

The substrate container 21 and the conductor plate 22 are connected by an insulator made from ceramics or teflon similarly to the aforementioned insulator. Because the substrate container 21 and the conductor plate 22 are connected by the insulator, heat is less transmitted as compare to a metal and thereby such effects are brought about that a heat retaining property is increased during formation of films and that energy may be saved.

The distance between the substrate container 21 and the electrode 17 or that between the substrate susceptor 20 and the electrode 17 are separated with a gap of 1 to 10 mm for example in which no discharge takes place between them.

The distance between the substrate container 21 and the first shield 18 and that between the conductor plate 22 and the second shield 19 are set to be within 5 mm. It is because when they exceed 5 mm, plasma leaks out to the reaction chamber 16 from spaces created by the substrate container 21 and the first and second shields.

The substrate container 21 is electrically insulated, so that the substrate, regardless whether it is a conductor or an insulating material, has the same floating potential with that of the substrate container 21. Accordingly, regardless of voltage of a RF voltage supplied, a difference between the plasma space potential and the substrate surface potential becomes small and damages due to sputtering becomes less regardless of the potential of the plasma space potential.

The substrate container 21 is provided so that the surface to be formed of the substrate orients along the direction of gravity, so that even if reaction products adhered on the upper part of the reaction chamber fall as flakes, they will not adhere on the surface to be formed.

The substrate container 21 may be made from a quartz, aluminum or other metals so long as it can insulate the container from surrounding conductors. The conductor plate 22 may be made from a metal and others that can hold earth potential.

In the present invention, in order to uniform a degree of plasma treatment, insulated plates are provided within the shield in a manner that the surface of the plates corresponds to the surface to be treated of the substrate. The insulated plates are provided to be coated by a coating film when the substrates are coated and to prevent a discharge from occurring between the electrode 17 and the substrate susceptors 20 by the insulated plate surface.

In FIG. 4, the surface of the insulated plates 23 is placed on the same plane on which the substrate is placed on the substrate susceptor 20.

The same number of insulated plates 23 with that of the substrate susceptors 20 are provided within the first shield 18 and the front and back faces of the insulated plates 23 are disposed corresponding respectively to the surfaces of the substrate susceptors 20, within the shield on the same plane on which the surface for placing the substrates of the substrate susceptors 20 are included. The insulated plates 23 are provided within the first shield 18 and are kept inside not to go out from the openings of the first and second shields. Lengths of one side of the insulated plate 23 and one side of the substrate susceptor 20 that face each other are equal.

The insulated plate 23 has to be separated from the electrode by a distance so that discharge will not occur between them and has to be insulated from the surrounding conductors.

Moreover, the insulated plate 23 serves for improving the uniformity of thickness of coating films and is effective for increasing the distance between the substrate container 21 and the electrode 17 in relation to carrying the substrate container 21.

It is desirable to provide the substrate in a range of 55 to 65% of the distance between the electrodes provided above and below it.

A heater for heating or retaining temperature of the substrate container 21 and the substrate is provided within the reaction chamber 16.

When there are no second shield 19 and conductor plate 22 provided outside among the shields surrounding the electrodes, floating potential is increased and thereby plasma is generated between the reaction chamber 15 and the first shield 18 and the substrate container 21 and the reaction chamber 18.

Figure 5:
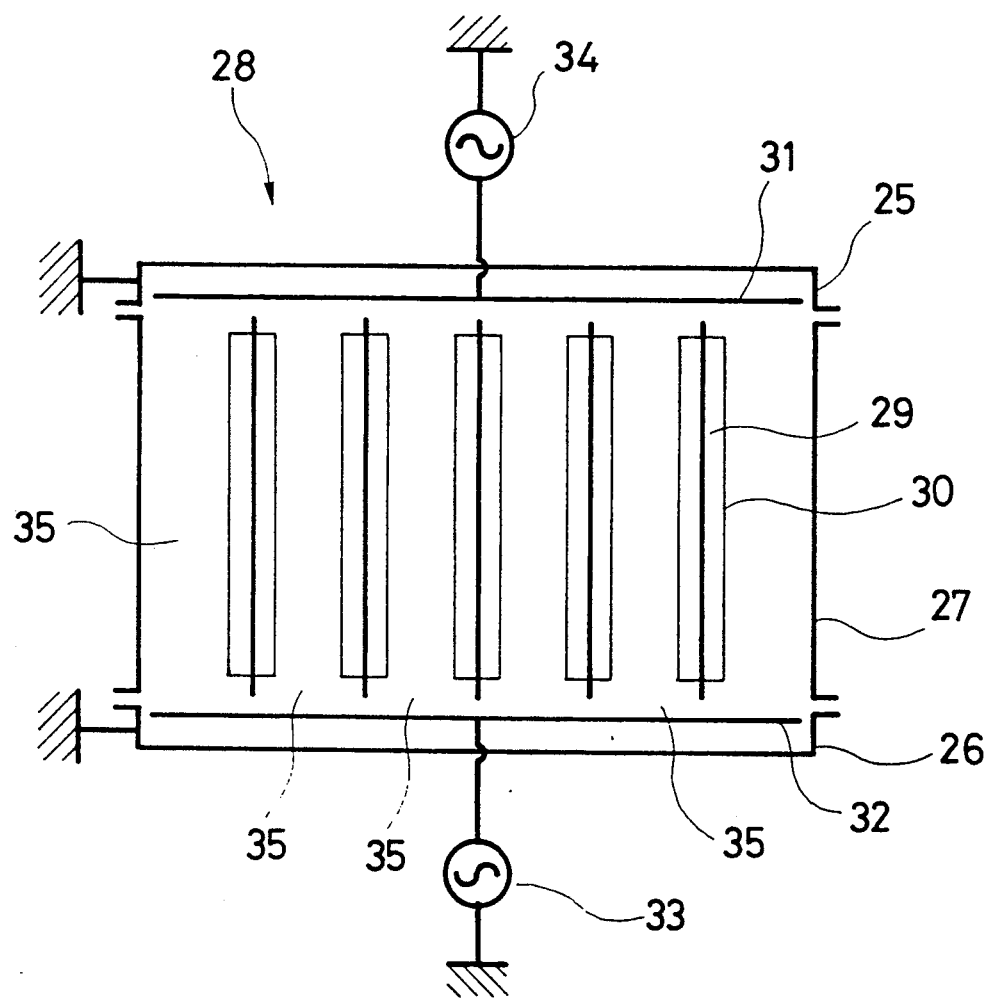
FIG. 5 is a schematic drawing illustrating a part around a discharge area of the plasma treatment apparatus of the present invention.

FIG. 5 is a schematic drawing illustrating another example of the plasma treatment apparatus of the present invention, wherein only a plasma discharge area within a reaction chamber and its surrounding part are shown. The discharge area of the plasma treatment apparatus of the present invention is defined to a space 28 which is surrounded by electrode shields 25 and 26 and outer wall of the container 27. The electrode shields are disposed closely to the electrodes and their potential is grounded to prevent a discharge from occurring between the electrode and other parts (parasitic discharge). Substrate susceptors 29 are kept in a condition in which its surface potential is floating. By doing like this, the ambient atmosphere which plasma contacts in the discharge spaces individually divided by the substrate susceptors 29 or the substrates 30 (divided into 5 parts in FIG. 5) can be kept in the floating condition except of the pair of the electrodes, thereby allowing to realize an uniform discharge and an uniform plasma treatment.

As an example of a means for keeping the surface potential of the substrate susceptors 29 in the floating condition, FIG. 5b shows a schematic section view of a material used for the container or susceptor. It may be realized when the container 27 and the substrate susceptor 29 are fabricated by the same material, by forming or coating a material which insulates the power for plasma discharge across the whole peripheral parts. The container or susceptor which can keep the surface potential of the susceptor in the floating condition may be provided in concrete by creating the container or the substrate susceptor using a metallic material such as aluminum and nickel, etc. or their alloy as a base material 41 and forming on the surface thereof an insulating film such as an oxide film and nitride film of the metallic material or an insulating film 40 of other materials by such a technology as plasma oxidizing, plasma nitriding, anode oxidizing or plasma flame coating.

Figure 6:
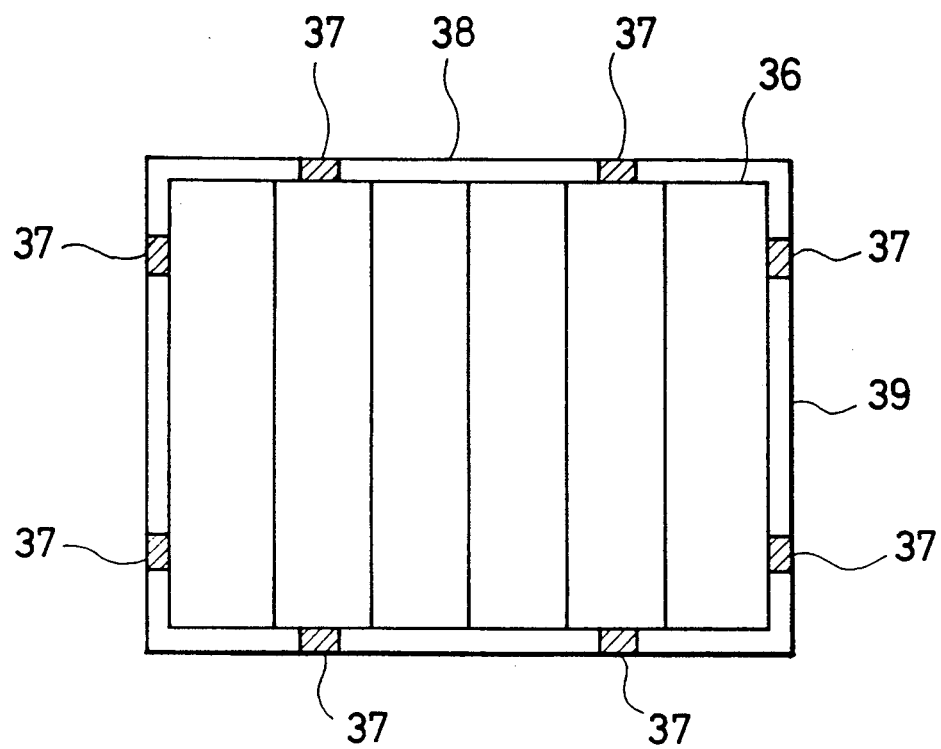
FIG. 6a is a schematic drawing illustrating a container and susceptors of the present invention.
FIG. 6b is a cross-sectional view of a material used for the container or the susceptor of the present invention.
Figure 6:
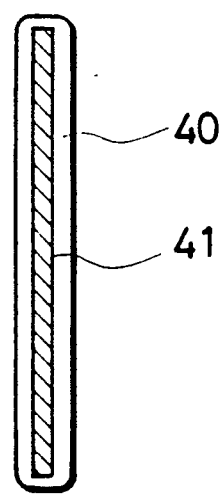

Moreover, the container and the substrate susceptor may be fabricated by a normal metallic material, not by such material on which the insulating material is coated, to realize the floating susceptor by making a double structured container to electrically insulate the outer container and the inner container which contains the susceptor. FIG. 6a is a schematic drawing illustrating such structure. This figure is a schematic drawing of the container 27 seen from the above and as seen from the figure, the inner container 36 containing the susceptors 38 is provided inside of the outer container 39, keeping a certain gap through the intermediary of insulating materials 37. When the container is set in a predetermined place within the reaction chamber, only the outer container is supported to be set within the reaction chamber, thereby allowing the inner container and the susceptor to be kept in the floating condition.

Accordingly, when the parts such as the susceptors for supporting the substrates and the surrounding walls of the container which are exposed to plasma atmosphere have thus insulated surfaces, a stable discharge and an uniform plasma treatment may be performed even if the gap for holding the substrate and the gap between the electrode and the susceptor are narrowed down.

Figure 2:
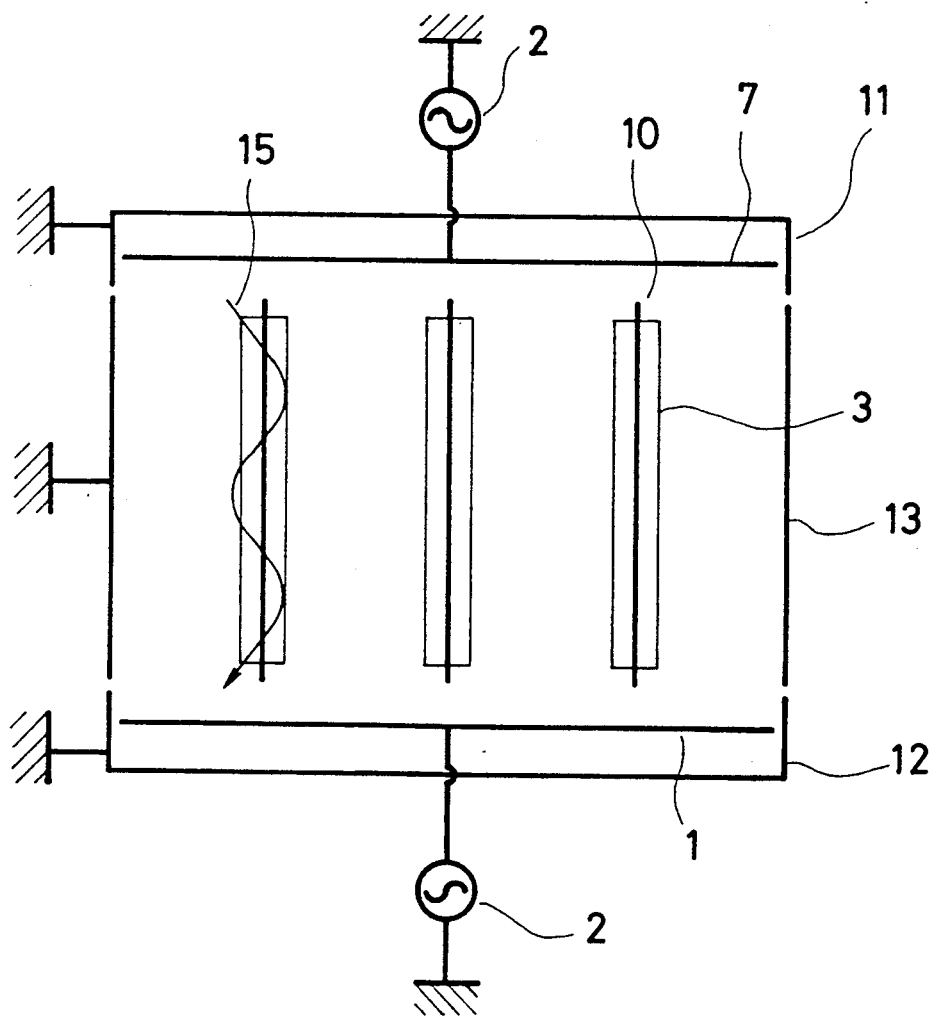
FIG. 2 is a schematic drawing of a discharge area of a prior art positive column plasma treatment apparatus.

That is, in the case of the prior art positive column plasma treatment apparatus as shown in FIG. 2, when the gap for holding the substrate and the gap between the electrode and the susceptor are narrowed down, the susceptor and the surface of the substrate become a path for flowing current from the electrode 7 to the electrode 1, as described before. The wave line 15 in FIG. 2 shows this state. Due to that, when a plasma discharge is stopped when the plasma discharge has been observed in the beginning of the discharge and when there is no reflection yet for power input, no reflection power is observed. The present invention is what eliminates such a current path and realizes a stable and uniform large area plasma discharge.

To that end, the present invention turns the container wall and the susceptor which contact with the plasma discharge atmosphere into a floating or insulated surface to shut down the path for current inputted for generating such plasma and to realize a stable discharge.

FIG. 7 shows another example of the present invention. This figure is also a schematic drawing illustrating only a plasma discharge area and its surrounding part within a reaction chamber. The discharge area of the plasma treatment apparatus of the present invention is defined by a space 45 surrounded by electrode shields 42 and 43 and the peripheral walls of a container 44. The electrode shields are closely disposed to the electrodes and their potential is grounded to prevent a discharge (parasitic discharge) from occurring between the electrodes and other parts.

The plasma discharge area 45 is apparently divided into a plurality of areas 53 by susceptors 46 and substrates 47 in the container. Furthermore, since the electrodes are provided right near the susceptors to reduce the volume of the apparatus, the areas become like individual reaction areas more and more and a stable and uniform discharge cannot be maintained by a prior art discharging method. Due to that, needle-like protrusions 52 are formed on the electrodes 48 and 49 as shown in the figure to concentrate discharge electric field and to be able to maintain an uniform and stable discharge in the individual reaction areas. These protrusions 52 are disposed at positions which correspond to the individual discharge areas on the electrodes 48 and 49.

Figure 8:
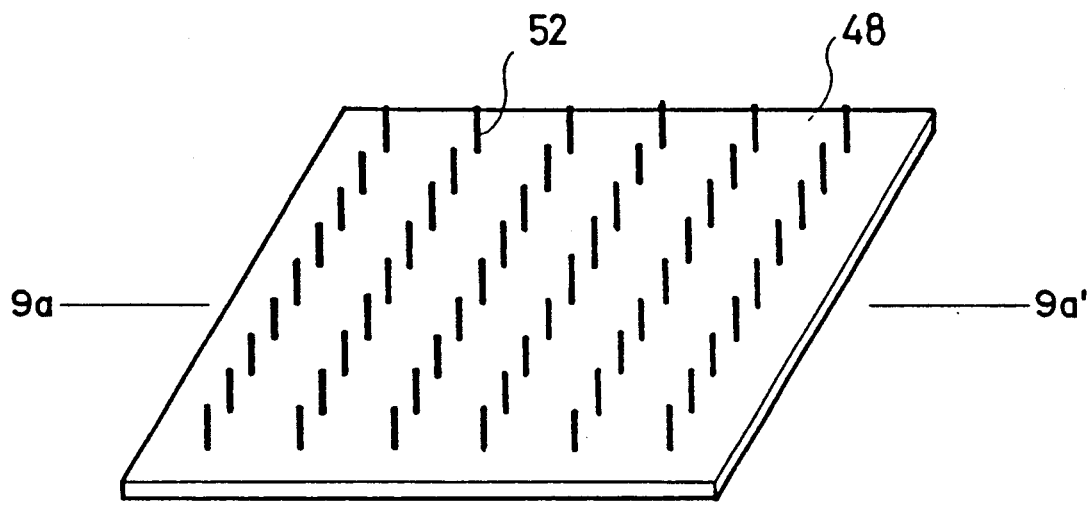
FIGS. 8a and 8b are schematic drawings illustrating electrodes of the present invention.
Figure 8:
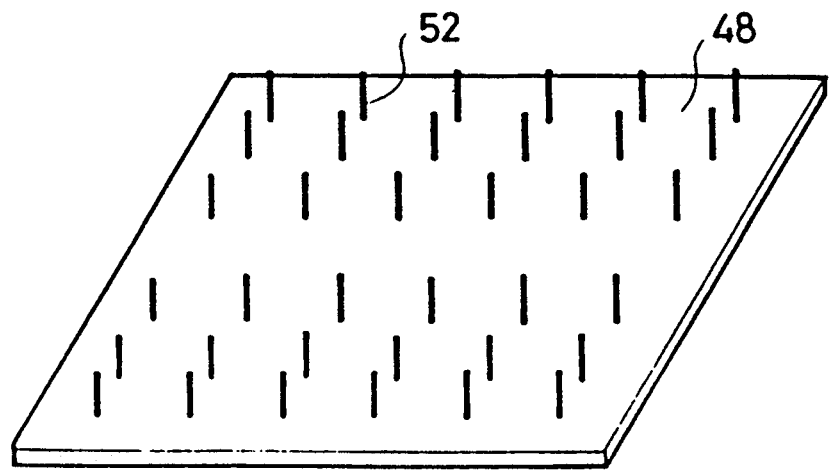

FIG. 8 shows the arrangement of the protrusions 52. FIG. 8a is a schematic drawing illustrating the part corresponding to the electrode part in FIG. 7, wherein the needle-like protrusions 52 made from the same material are disposed with a equal interval on the surface of the electrode 48 at the positions which correspond to the individual reaction areas.

When the arrangement of the protrusions 52 is changed so that their density is increased near the container as shown in FIG. 8b, discharge is stabilized and differences of plasma conditions among individual reaction areas are eliminated. Accordingly, a more uniform plasma discharge can be realized.

Figure 9:
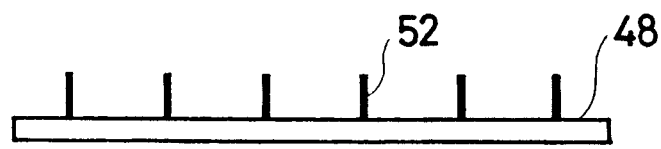
FIGS. 9a to 9d are schematic drawings of respective protrusions on the electrode of the present invention.
Figure 9:
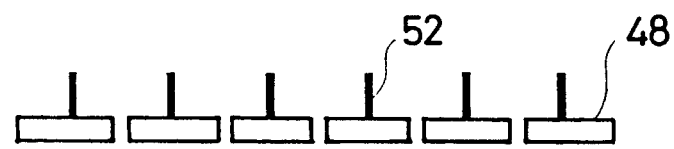
Figure 9:
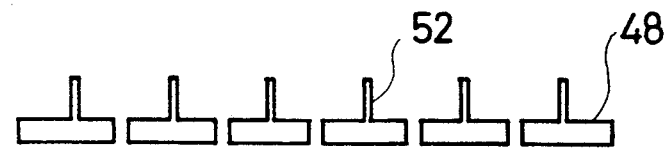
Figure 9:
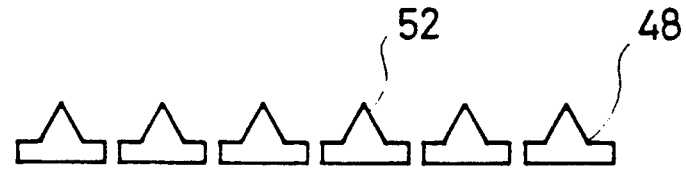

In FIG. 8, the protrusions on the electrode are arranged with a certain gap. This state is shown in FIG. 9a which is a section view that corresponds to A—A' section in FIG. 8. According to the present invention, the needle-like protrusions may be arranged not only on a plate but also on such a plate having holes as shown in FIG. 9b to provide an uniformity to flows of gas. Moreover, as shown in FIGS. 9c and 9d, the electrode may be divided and not a needle but a long cylindrical or angle protrusions may be provided on each of them. Concentration states of each electric field differ further when the shape of the head of the protrusion is round, sharpened or trapezoidal. Due to that, such a countermeasure as adding a chalk coil and others on a discharge power source circuit needs to be taken in accordance to the shape of the head.

The shape of the electrode itself needs not be plain plate-like but may be corrugated plate-like. In such a case, new protrusions need not be provided so long as it can bring about the concentration of the electric field. It may be not only a plain plate, but also be a mesh or punch-through plate.

Figure 10:
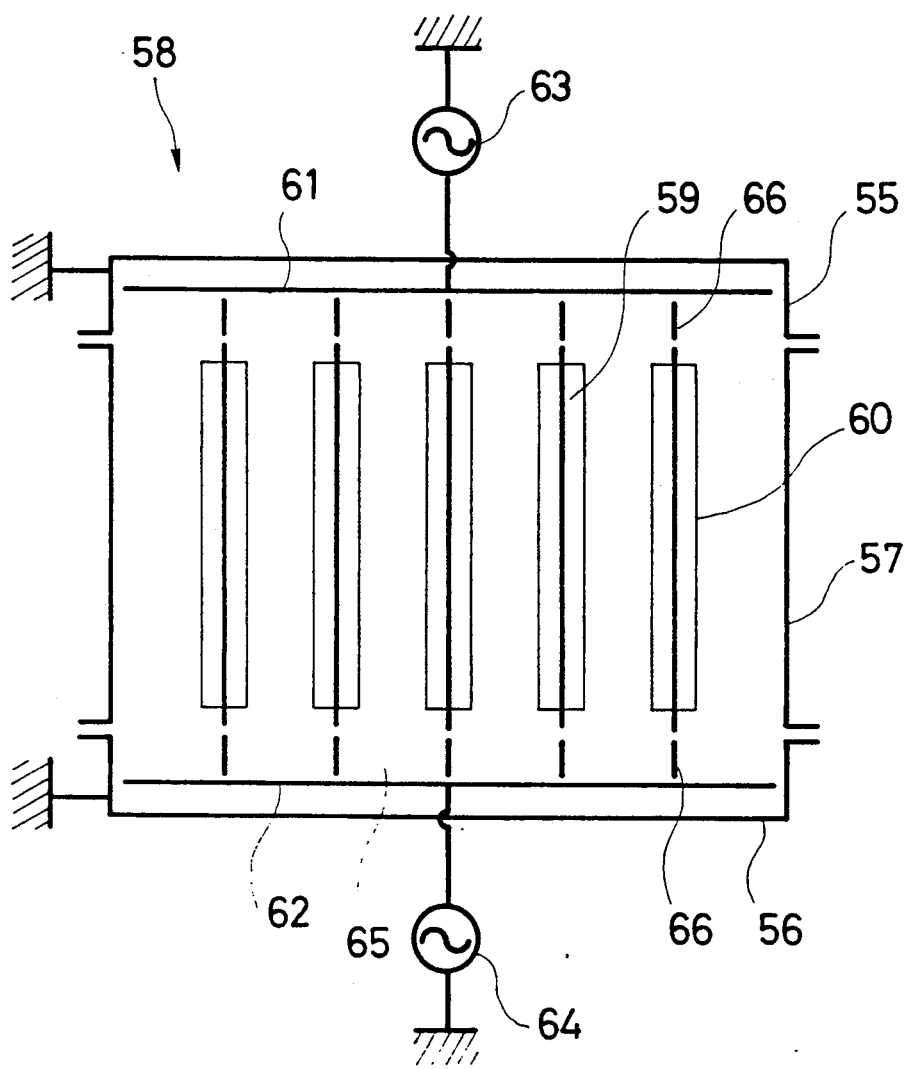
FIG. 10 is a schematic drawing illustrating a part around the discharge area of the plasma treatment apparatus of the present invention.

FIG. 10 shows one example of the present invention. It is also a schematic drawing similarly to FIGS. 5 and 7, wherein only a plasma discharge area and its surrounding part within a reaction chamber are shown. The discharge area of the plasma treatment apparatus of the present invention is defined by a space 58 which is surrounded by electrode shields 55 and 56 and the peripheral walls of a container 57. The electrode shields are disposed closely to the electrodes and their potential is grounded to prevent a discharge (parasitic discharge) from occurring between the electrodes and other parts.

The plasma discharge area 58 is apparently divided into a plurality of areas 58 by susceptors 59 and substrates 60 in the container. Moreover, auxiliary susceptors 66 are provided between the electrodes 61 and 62 and the substrate susceptor 59 at positions on which the same planes with the substrate susceptors may be formed and on which they are separated from the substrate susceptors. Because the auxiliary susceptors 66 exist, ununiform plasma discharge part moves from the surrounding part of the substrate to be treated to the auxiliary susceptor part. Due to that, the ununiform plasma part around the substrate is eliminated and an plasma treatment effective area covering an area of the substrate may be increased.

In addition to that, a provision of such protrusions that bring about concentration of electric field on the electrode part at positions which correspond to individual discharge areas allows to stabilize discharge, to eliminate differences of plasma conditions among the individual reaction areas and to realize a more uniform plasma discharge.

Moreover, by turning the surface of the container and the susceptors into a floating condition, the plasma discharge may be stabilized, differences of plasma conditions among the individual reaction areas may be eliminated and a more uniform plasma discharge may be realized.

In any of the cases, the discharge may be stabilized by preventing the power for discharge from leaking and flowing on the surface of the substrate like in FIG. 2.

The electrode needs not be a plane plate, but may be a corrugated plate. In such a case, new protrusions need not be provided so long as it brings about concentration of the electric field. Moreover, it may be a mesh or punch-through plate.

Figure 11:
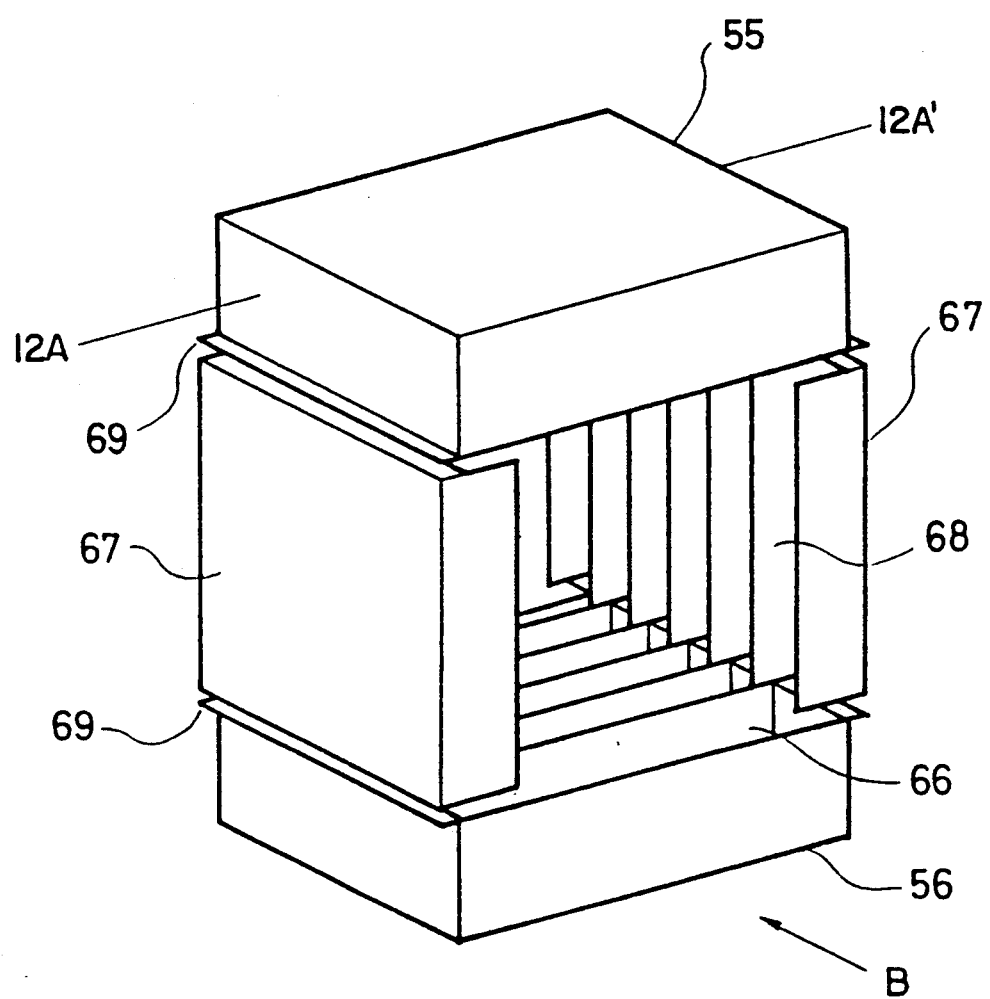
FIG. 11 is a schematic drawing illustrating a relationship between electrode shields and auxiliary shields of the present invention.

As for the position for setting the auxiliary susceptor, similarly to the case when the auxiliary susceptor is set in the direction of the pair of the electrodes on the plane extended from the substrate susceptor as shown in FIG. 10, they may be set in the direction in which no electrode is set and in the both directions thereof on the extended plane of the substrate susceptor; they may be set at the side of necessary substrate susceptor in accordance to a distribution of treatment of a plasma treatment apparatus. Among them, an example in which the auxiliary susceptors are provided on the whole sides of the substrate on the extended plane of the substrate susceptor is schematically shown in FIG. 11. In the figure, the auxiliary susceptors 66 are provided inside of the electrode shields 55 and 56 and auxiliary shields 67 are provided on the both surfaces that connect the electrode shields. Auxiliary susceptors 68 are also provided within the auxiliary shields 67.

In this case, the peripheral walls of the container are not provided on the upper and lower electrodes and on the surface of the auxiliary shields which are located at the sides of the electrode. When the container is to be positioned at a certain position within the reaction chamber, it is positioned moving in the direction in which no auxiliary susceptor is provided so that the substrate susceptor of the container and the auxiliary susceptors 66 and 68 around it form almost the same plane.

Figure 12:
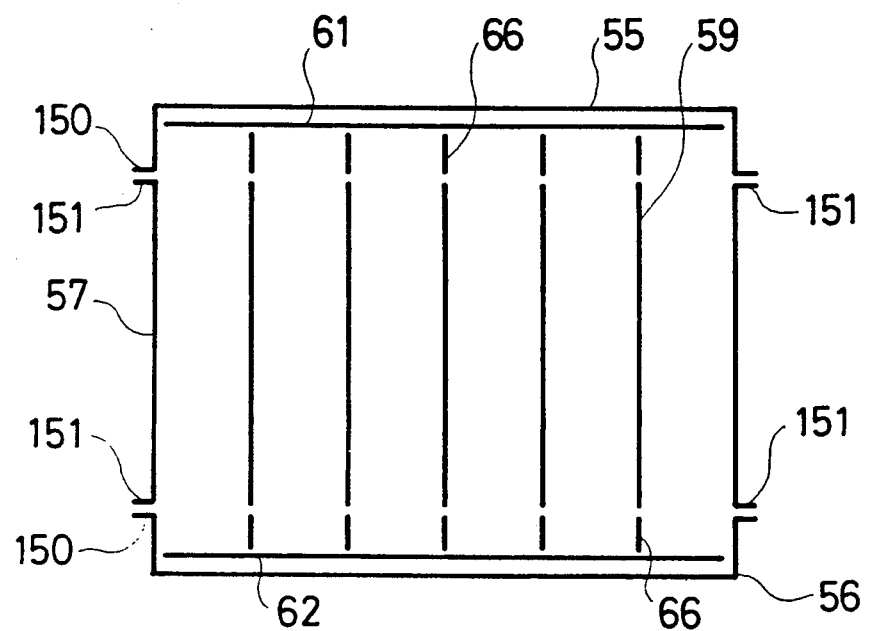
FIGS. 12a and 12b are schematic drawings illustrating a relationship among the electrodes, electrode shields, substrate susceptors and auxiliary susceptors of the present invention.
Figure 12:
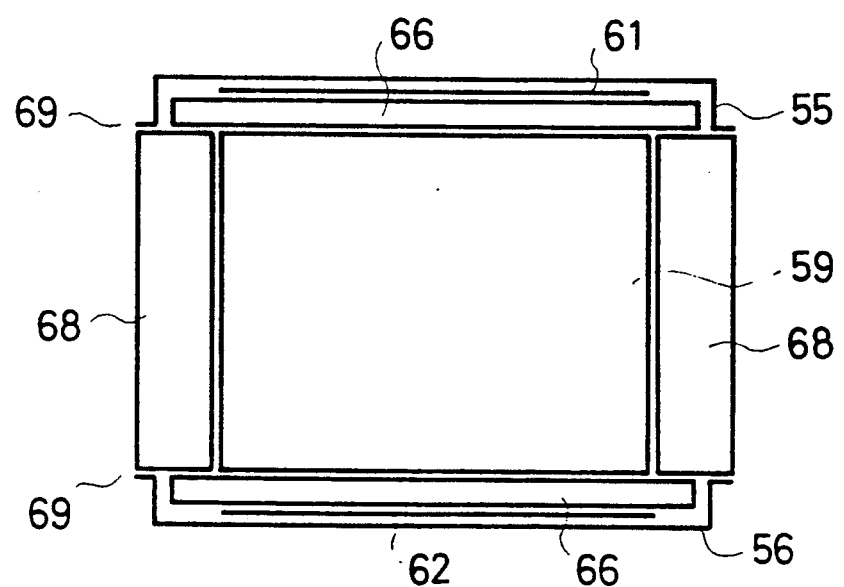

In order to explain this state in further detail, a position relationship of the container, the substrate susceptors, the electrode shields, the electrodes and the auxiliary susceptors along C—C' section in FIG. 11 is shown in FIG. 12a and the position relationship of them seen from the direction of arrow B in FIG. 11 is schematically and sectionally shown in FIG. 12b.

As seen from FIG. 12a, the auxiliary susceptor 66 is located in between the electrodes 61 and 62 and the substrate susceptor 59 and structures almost the same plane with the substrate susceptor 59. As seen also from FIG. 12b, the auxiliary susceptors 68 are provided within the auxiliary shield 67 on the sides other than that of the electrodes 61 and 62. Due to that, in this case, the whole sides of the substrate susceptor 59 are surrounded by the auxiliary susceptor 66. Moreover, the end of the auxiliary shield 67 and the end of the electrode shields are extended closely as indicated by the reference numeral 69 to prevent plasma discharge from leaking from around joints of the electrodes 55 and 56 and the auxiliary shield 67 and to limit the plasma discharge within the discharge area not to contact to other walls of the reaction chamber.

There is no particular restriction on a material used for this auxiliary susceptor, so long as it is electrically insulated from the electrode. Potential of the auxiliary susceptor is desirable to be almost equal to that of the substrate susceptor. That is, when the potential of the substrate susceptor is maintained in a floating condition, it is desirable to maintain the auxiliary susceptor similarly in the floating condition for realizing a stable discharge and uniform discharge in a large area.

Several embodiments will be shown below.

FIRST EMBODIMENT

Figure 13:
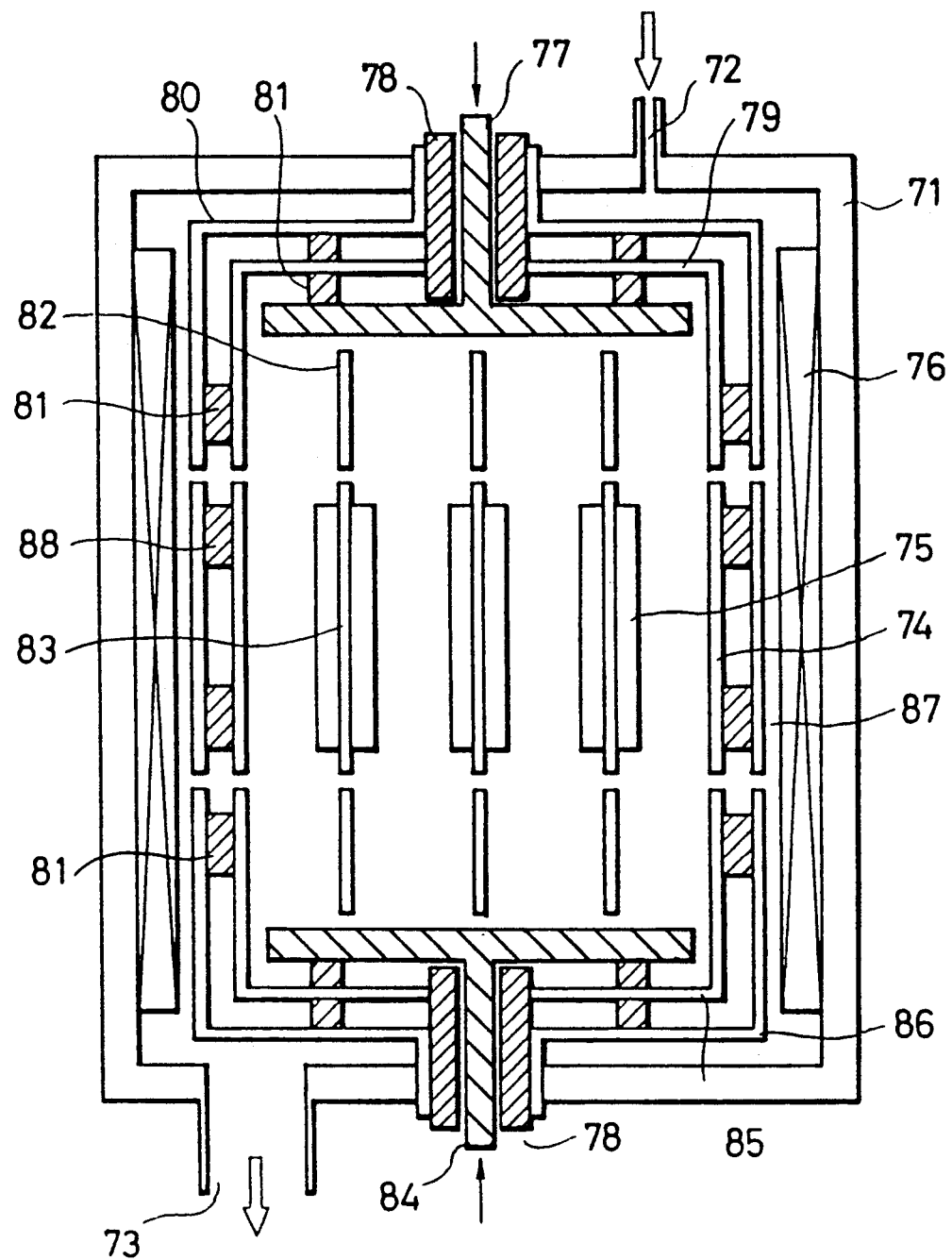
FIG. 13 is a drawing illustrating a plasma gaseous reaction apparatus of the present invention.

FIG. 13 shows one embodiment of the present invention, wherein an example of a plasma CVD apparatus is shown.

A reaction chamber 71 is kept electrically in earth potential and is provided with a reaction gas inlet 72 for introducing reaction gas necessary for forming films and a gas outlet 73 for exhausting unnecessary reaction products, nonreactive reaction gas and carrier gas. A heater 76 for heating a substrate 75 through the intermediary of a substrate container 74 is provided within the reaction chamber 71. The substrate container 74 is made of aluminum having an internal size of 75 (W)×75 (D)×25 (H)cm and substrate susceptors 83 are provided with 6 to 9 cm of intervals within it. Although the number of the substrate susceptors 83 and the size of the substrate container 74 do not match since this is a schematic view, actually the substrate susceptors 83 are disposed with the aforementioned intervals to be accommodated in the substrate container 74.

The heater 76 is infrared lamp heater having 66 cm of total length and 62 cm of luminous section. 11 of them are provided at both left and right sides in the figure between from the upper shields 79 and 80 to the lower shields 85 and 86 by 4 cm of intervals and by being separated from the conductor plate 87 by 15 cm.

Reaction chambers are connected adjoining each other in this side and the back side of the sheet in this figure and a switching valve is provided between the reaction chambers to keep the ambient atmospheres of the reaction chambers independent. Heaters are not provided in order to carry the substrate container 74.

The heaters may be provided at upper and lower part of the electrodes 77 and 84 beside providing at the left and right within the reaction chamber as in this embodiment. Although the heaters 76 are arranged transversely so that the longitudinal direction of the infrared lamp heater becomes vertical to the sheet surface, the heaters may be arranged from this side of the figure to the back side of the figure so that they become parallel to the sheet surface.

The electrodes 77 and 84 are disposed at the top and bottom so that they face each other. The electrodes are made from aluminum and have a size of 75 cm×75 cm. A plurality of holes with 6 mm of diameter are created on them with 9 mm of pitch and with 30% of aperture rate.

The electrodes 77 and 84 are fixed to the reaction chamber 71 through insulators 78. Among shields that cover the electrodes 77 and 84, an inner first shields 79 (the first shield at the top) and 85 (the first shield at the bottom) are both made from aluminum and a plurality of holes with 3 mm of diameter are created with 5 mm of pitch on them. They cover the electrodes 77 and 84 respectively with 1 to 10 mm of gap (with 5 mm of gap in this embodiment).

Outer second shields 80 and 86 are made from the same material with that of the first shields and a plurality of holes with 3 mm of diameter are created on them with 5 mm of pitch. They cover the first shields 79 and 85 with 5 mm of gap in this embodiment.

The second shields 80 and 86 are fixed to the reaction chamber 71 and are maintained in earth potential similarly to the reaction chamber. The first shields 79 and 85 and the second shields 80 and 86 are electrically insulated and the first shields 79 and 85 are fixed to the second shields 80 and 86 through the intermediary of insulators 81.

Plates 82 insulated within the first shields 79 and 85 are provided by the same number with that of the substrate susceptors 83 on the same plane with the substrate susceptors 83 provided in a substrate container 74, which is described later.

These insulated plates 82 are fixed to the first shields 79 and 85 and are insulated from both first shields 79 and 85.

The substrate container 74 is provided in a manner pinched by a pair of facing shields for covering the electrodes 77 and 84.

The substrates 75 are provided by pinching the substrate susceptors 83 at the both sides thereof. In the figure, the substrate 75 is disposed at a position which is 60% of distance between the electrodes 77 and 84, i.e. by separating it by 20% of the distance from the electrode 77 and by 20% of distance from the electrode 84.

The outside of the substrate container 74 is surrounded by conductors 87 except of the area where the electrodes face each other. The conductors are made from aluminum and have a plurality of holes with 3 mm of diameter created on them with 5 mm of pitch similarly to the first and second shields. The substrate container 74 is fixed to the conductors 87 with 5 mm of gap through the intermediary of insulators 88 and thereby the substrate container 74, the substrate susceptors 83 and the substrates 75 are insulated from the surrounding conductors.

Figure 14:
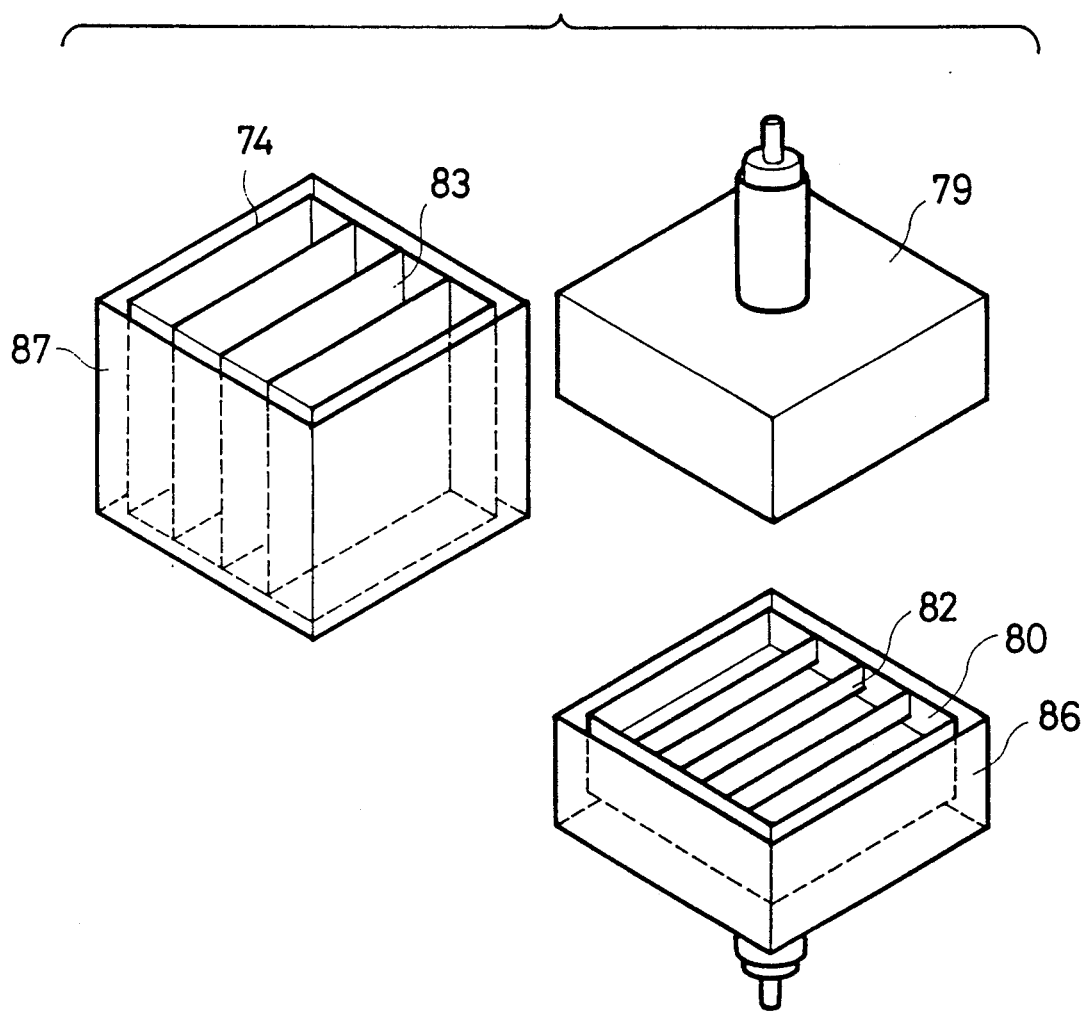
FIG. 14 is a drawing illustrating a substrate container of the plasma gaseous reaction apparatus of the present invention.

FIG. 14 shows appearances of the first shields 79 and 85, the second shields 80 and 86 and the substrate container 74.

In operation, the reaction chamber 71 is exhausted by a vacuum pump from the gas outlet 73 and the reaction gas is supplied from the reaction gas inlet 72 to create an adequate discharge pressure. The reaction gas reaches to the upper electrode 77 from the plurality of holes on the first and second shields and reaches to the substrate 75 passing through the holes on the electrode 77. Unnecessary reaction products, non-reactive reaction gas and carrier gas reach to the gas outlet 73 passing through the plurality of holes on the lower electrode 84 and the plurality of holes on the first and second shields and are discharged out of the reaction chamber 71.

Figure 3:
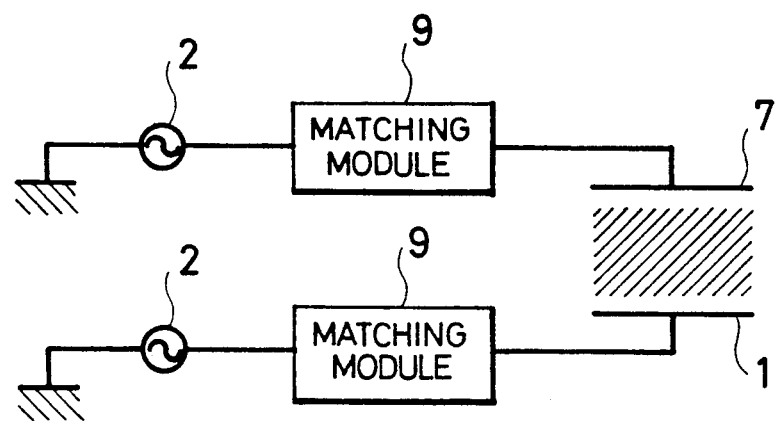
Figure 3:
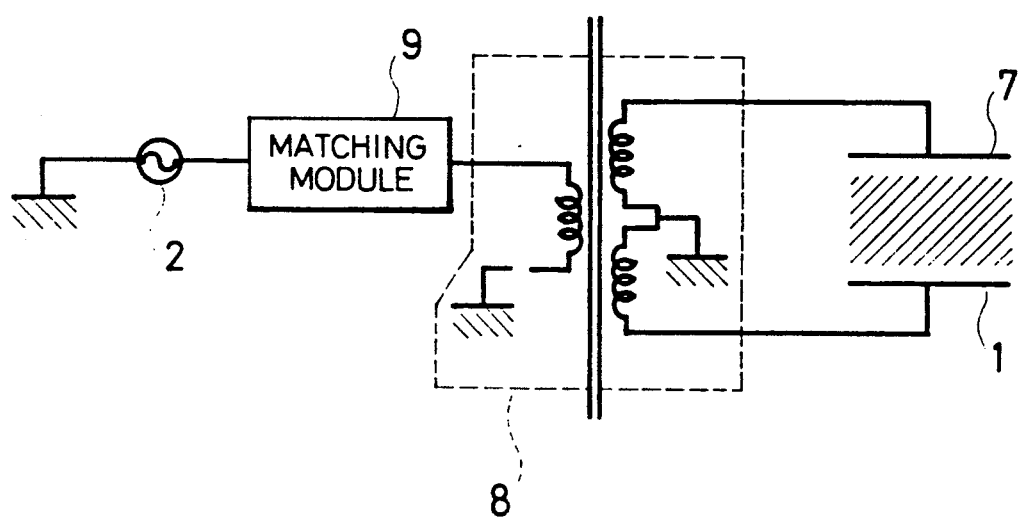

High frequency power sources are connected to the electrodes 77 and 84 as shown in FIG. 3a, and when high frequency power is supplied, a plasma is generated between the electrodes 77 and 84. High frequency power with 13.56 MHz of frequency is used for the power sources.

The gap between each first shield 79 and 85 and the substrate container 74 is set to a degree of gap by which the plasma will not leak from the space surrounded by the shields and the substrate container into the reaction chamber, i.e. 5 mm in this embodiment.

Similarly, the gap between the second shields 80 and 86 and the conductor plate 87 is set to a degree of gap by which the plasma will not leak from the space surrounded by the shields and the substrate container into the reaction chamber, i.e. 5 mm in this embodiment.

By doing like this, plasma potential in the plasma and potential of the substrate become less, so that sputtering on the substrate is eliminated and coating films are not damaged.

Figure 15:
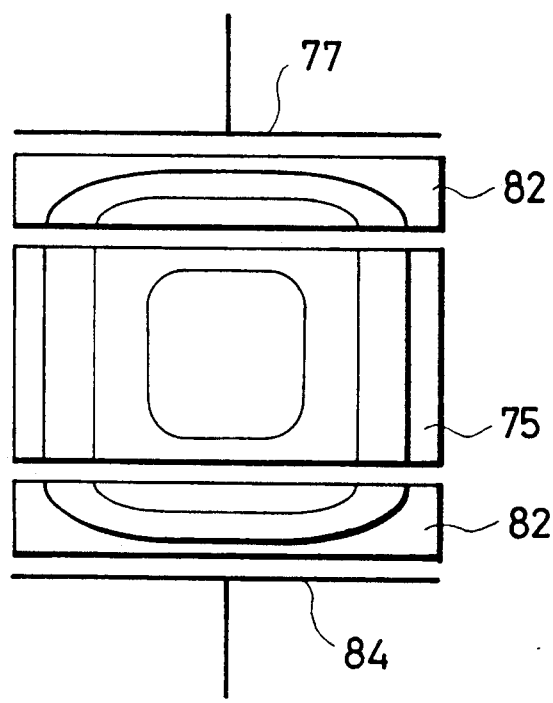
FIGS. 15a and 15b are drawings illustrating a coating film formed using the plasma gaseous reaction apparatus of the present invention.
Figure 15:
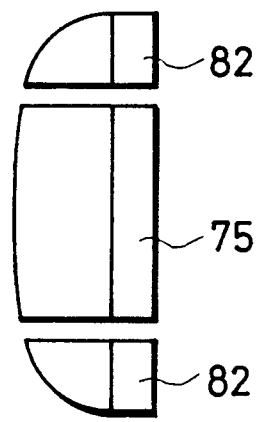

Moreover, as shown in FIG. 15, since there exist the insulated plates 82, a coating film to be formed is uniformly formed on the substrate 75. FIG. 15 typically shows states of the coating film formed using the apparatus of the present invention. In FIG. 15a, solid lines on the plates 82 and the substrate 75 are schematic lines illustrating a state of distribution of thickness of the film which can be confirmed visually from the distribution of thickness of the film and the state of its cross section in the thickness direction is shown in FIG. 15b.

Figure 16:
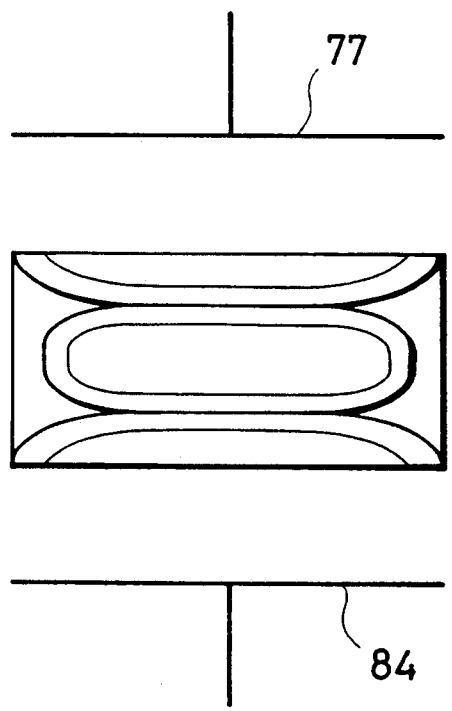
FIGS. 16a and 16b are drawings illustrating a coating film formed using a prior art plasma gaseous reaction apparatus.
Figure 16:
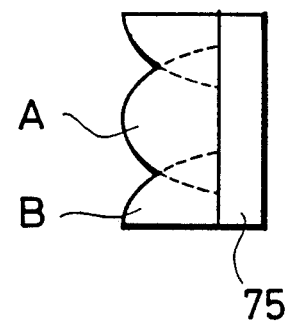

Next, effects of the insulating plates 82 when they are placed will be described. FIG. 16a shows a relationship between the substrate 75 and the upper and lower electrodes 77 and 84. In the figure, the upper and lower electrodes are separated from the substrate 75 by a degree of distance by which discharge is caused between the substrate and the electrodes.

FIG. 16b shows a section view of the coating film formed in this state. As seen from the figure, the thickness of the film decreases from the center of the substrate toward the both ends of the substrate (part indicated by A) and after passing a certain point, the thickness increases again (parts indicated by B). When the distance between the substrate and the electrodes are separated like this, a film with uniform thickness cannot be obtained.

Then, when the distance between the substrate 75 and the upper and lower electrodes 77 and 84 are reduced (less than 10 mm) as shown in FIG. 17a, a film obtained has no decrease of the thickness from the center of the substrate toward the both ends of the substrate and no part indicated by B in FIG. 16b is seen as shown in FIG. 17b which illustrates a section view of the film obtained. In this case, however, thickness of the film at the both ends of the substrate is thin.

According to the present invention, the insulated plates 82 are inserted respectively between the substrate 75 and the upper and lower electrodes 77 and 84 to form a coating film not only on the substrate but also on the insulated plates 82 to bring the distribution of thickness of the coating film on the substrate closer to a constant distribution.

Figure 17:
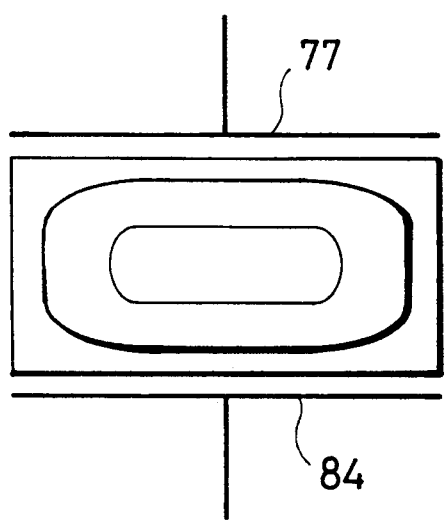
FIGS. 17a and 17b are drawings illustrating a coating film formed by the prior art plasma gaseous reaction apparatus.
Figure 17:
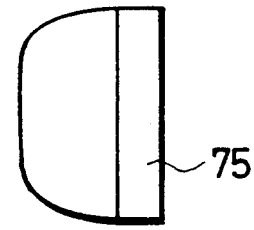

Uniformity of thickness of films formed in a case when the coating film was formed on the substrate without inserting the insulated plates 82 and in a case when the film was formed on the substrate using the apparatus of the present invention, by keeping the distance between the electrodes as 10 mm as shown in FIG. 17, were compared and its result is shown in Table 1 below.

Figure 18:
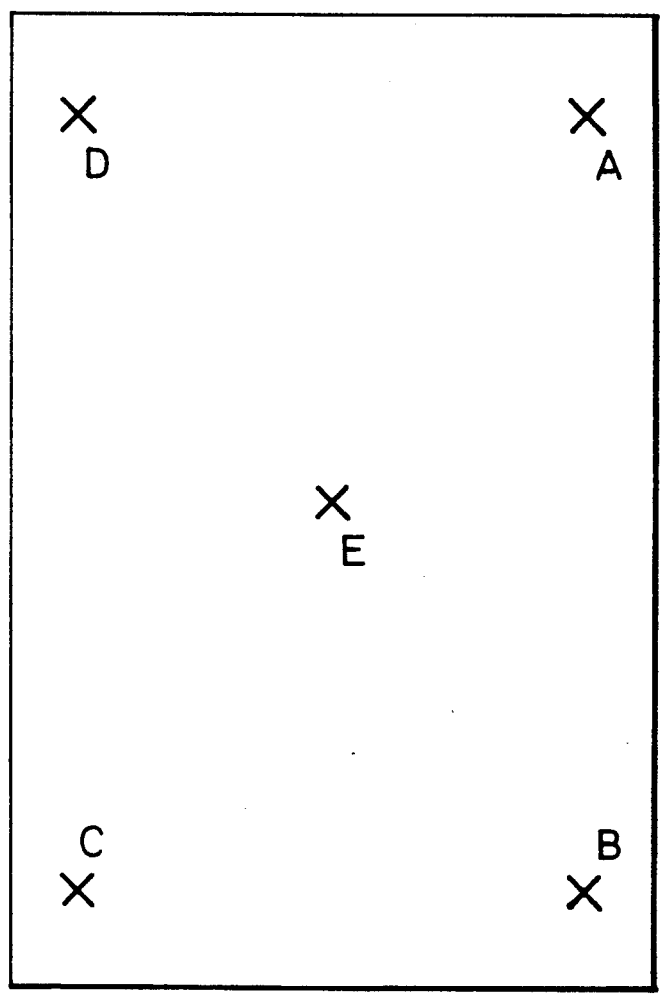
FIG. 18 is a drawing indicating points for measuring thickness of the coating film.

As conditions for fabricating the films in both present embodiment and comparison example, 100% SiH$_4$ was used as the reaction gas, plasma gaseous reaction was caused in 200° C. of substrate temperature and amorphous silicon films were formed on the substrates so that their thickness would become 4000Å in the middle of the substrate. The thickness of the films obtained was measured at each point A, B, C, D and E on the substrate as shown in FIG. 18, and its result is as follows:

TABLE 1

| Measuring Point | Present Embodiment | Comparison Example |
| --- | --- | --- |
| A | 3500 Å | 3000 Å |
| B | 3500 Å | 3000 Å |
| C | 3500 Å | 3000 Å |
| D | 3500 Å | 3000 Å |
| E | 4000 Å | 4000 Å |

As seen from this result, the insulated plates 82 are effective for uniforming the coating film.

SECOND EMBODIMENT

Figure 19:
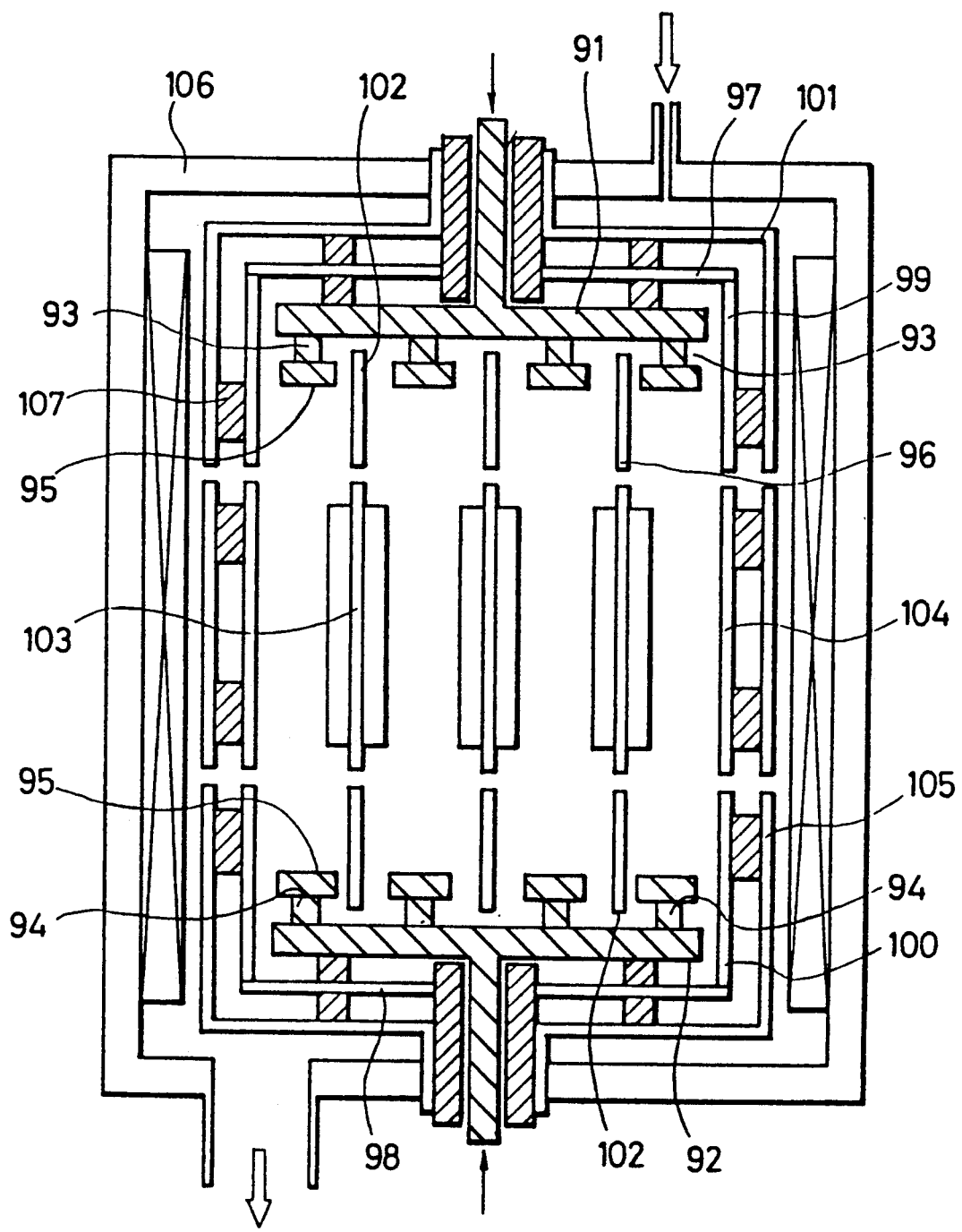
FIG. 19 is a drawing illustrating a plasma gaseous reaction apparatus of the present invention.

According to a second embodiment, the electrodes 77 and 84 in the apparatus in the first embodiment is divided into main electrodes 91 and 92 and sub-electrodes 93 and 94 as shown in FIG. 19.

Moreover, among shields that cover the main electrodes 91 and 92 and the sub-electrodes 93 and 94, the inner first shields in the first embodiment are divided into upper shield plates 97 and 98 for covering the upper part of the electrode and to side shield plates 99 and 100 for covering the side of the electrode.

Structure of each parts of the apparatus other than those described below are the same with those described in the first embodiment.

The upper shield plates 97 and 98 are made from aluminum and a plurality of holes with 3 mm of diameter are created on them with 5 mm of pitch. They cover the main electrodes 91 and 92 with a degree of gap, i.e. 5 mm in this embodiment, by which no discharge is caused with the main electrodes.

The side shield plates 99 and 100 are made from aluminum and surround and cover the sides of the sub-electrodes 93 and 94 with a degree of gap, i.e. 5 mm in this embodiment, by which no discharge is caused with the head portions of the sub-electrodes.

The second shield 101 and 105 are made from aluminum and a plurality of holes with 3 mm of diameter are created on them with 5 mm of pitch, similarly to those in the first embodiment. They cover the upper shield plates 97 and 98 and the side shield plates 99 and 100 with a gap of 5 mm in this embodiment.

The second shields 101 and 105 are fixed to a reaction chamber 106 and are maintained to earth potential similarly to the reaction chamber.

The upper shield plates 97 and 98 and the side shield plates 99 and 100 are fixed to the second shields 101 and 105 through the intermediary of insulators 107.

The main electrodes 91 and 92 are made from aluminum with a size of 75×75 cm and a plurality of holes with 3 mm of diameter are created with 5 mm of pitch and with 30% of aperture rate.

The sub-electrodes 93 and 94 are made from aluminum similarly to the main electrodes and a plurality of holes with 6 mm of diameter are created with 9 mm of pitch. The sub-electrodes 93 and 94 may be of a 8-mesh electrode.

As shown in FIG. 19, the head portion 95 of the sub-electrodes 93 and 94 is larger than the part connected to the main electrodes 91 and 92 and each of the enlarged portion extends from this side of the sheet toward the inside along the substrate.

The head portion 95 of the sub-electrodes 93 and 94 is provided closer to the substrate than an edge portion 102 of the insulated plate 96 which is closer to the electrode. This is important for causing plasma assuredly between the substrate susceptor 103 and adjoining substrate container 104 and between adjoining substrate susceptors 103.

Although integrated sub-electrodes and main electrodes are used in this embodiment, they may be fabricated separately and be connected.

Beside them, the substrate container 104 and the substrate susceptor 103 are structured in the same manner with those in the first embodiment.

According to the second embodiment, even if the thickness of a coating film on the substrate differs depending on places on the substrate, plasma condition may be easily controlled by adequately adjusting the length of the sub-electrodes 93 and 94 to closer to or father from the substrate.

THIRD EMBODIMENT

According to the present embodiment, the sub-electrodes in the second embodiment are modified to be an independent electrode pair per each facing sub-electrodes and each of the pair of the electrodes are connected with the high frequency power source as shown in FIG. 3a.

Figure 20:
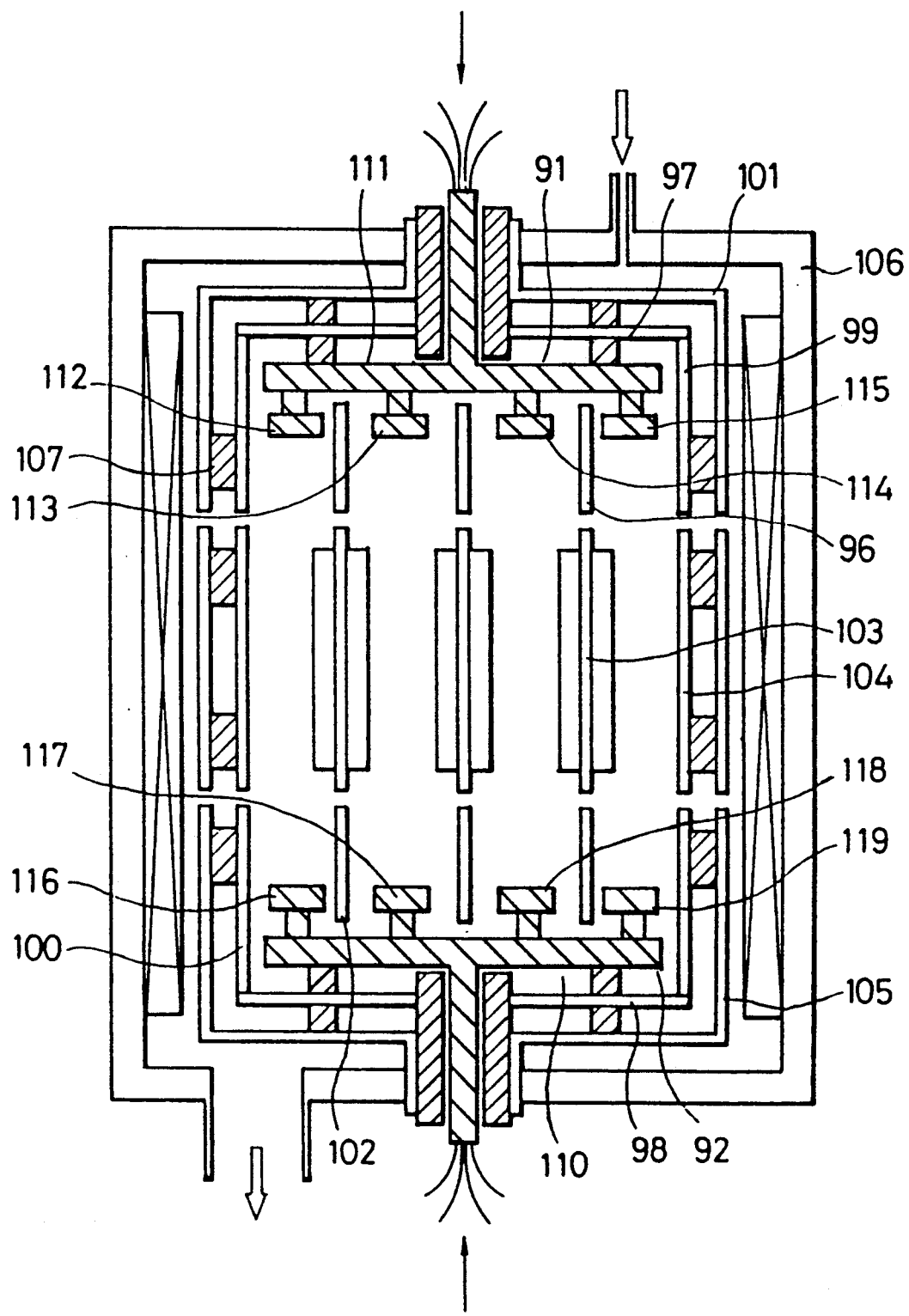
FIG. 20 is a drawing illustrating a plasma gaseous reaction apparatus of the present invention.

FIG. 20 shows an apparatus according to the present embodiment. The parts having the same structure with those in the second embodiment are designated with the identical numeral and code.

This apparatus is provided with electrodes comprised of upper electrode supports 111 and the lower electrode support 110 made of a metal which correspond to the main electrodes in the second embodiment, a plurality of upper electrodes 112, 113, 114 and 115 and facing to them, lower electrodes 116, 117, 118 and 110 which correspond to the sub-electrodes in the second embodiment.

The upper electrodes and the upper electrode support and the lower electrodes and the lower electrode support are connected through the intermediary of insulators. The electrode supports is made of aluminum having a plurality of holes with 3 mm of diameter and with 5 mm of pitch in 30% of aperture rate. The upper and lower electrodes have a plurality of holes with 6 mm of diameter and with 9 mm of pitch.

As shown in FIG. 20, the head portion of the upper and lower electrodes are larger than the part connected to the upper electrode support 111 and the lower electrode support 110 and each of these electrodes extends from this side of the sheet toward the inside along the substrate.

A relationship among the upper and lower electrodes, the side shield plates 99 and 100 and the insulated plates 96 is the same with that in the second embodiment.

A high frequency power sources (13.56 MHz) are connected to the upper electrode 112 and the lower electrode 116 which faces to the upper electrode 112 as shown in FIG. 3a. Similarly, the high frequency power sources are connected independently to the upper and lower electrodes 113 and 117, the upper and lower electrodes 114 and 118 and the upper and lower electrodes 115 and 119.

According to the present embodiment, power to be supplied to each electrode may be controlled, so that even if thickness of a coating film formed on the substrate between the upper electrode 114 and the lower electrode 118 differs from that on another substrate for example, the film may be fabricated with uniform thickness by adjusting the power to be supplied to the upper electrode 114 and the lower electrode 118.

FOURTH EMBODIMENT

According to the present embodiment, such a discharge area structure as shown in FIG. 5 is applied to a positive column type plasma CVD apparatus.

Figure 21:
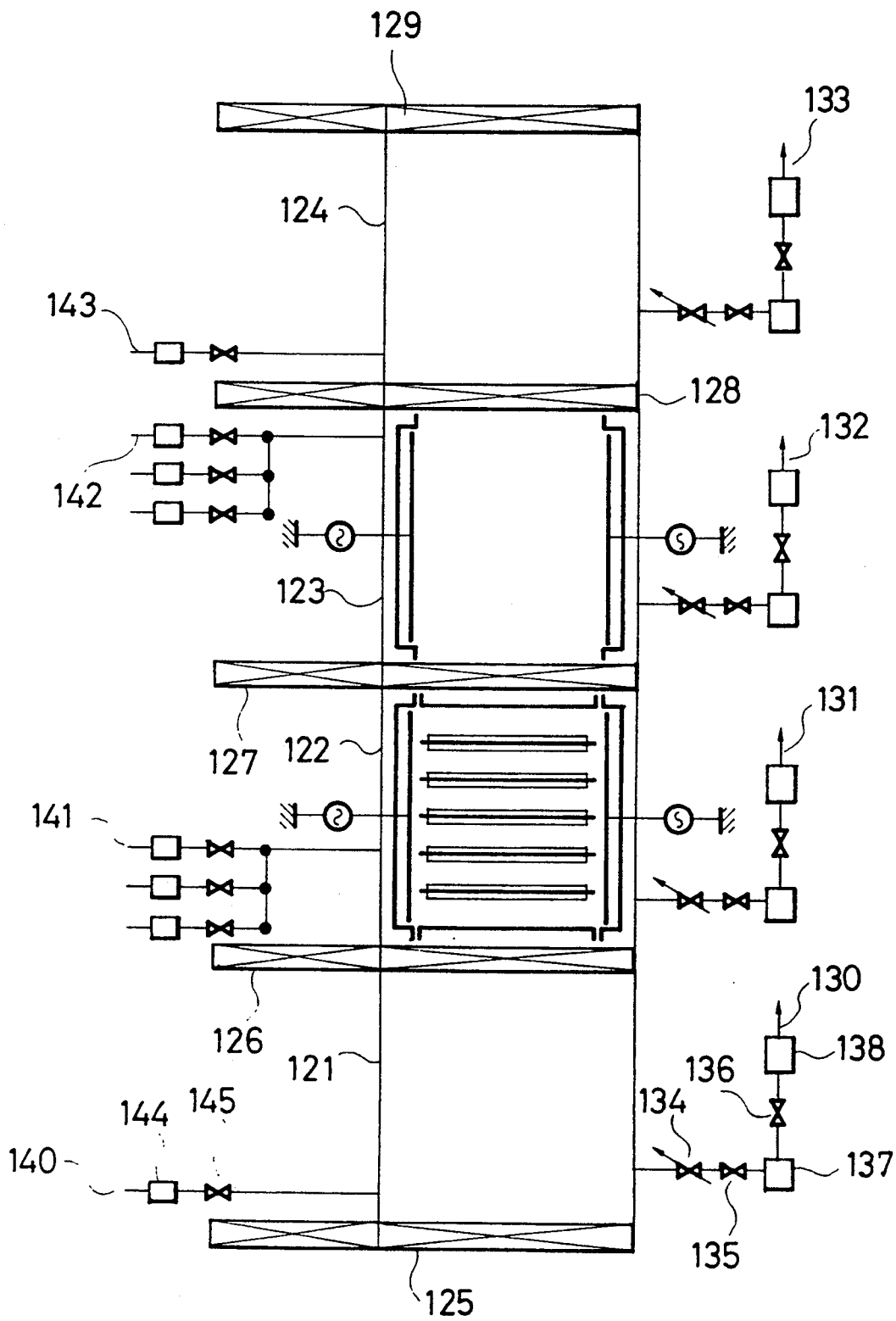
FIG. 21 is a schematic diagram illustrating when the construction of the present invention is applied to a multi-chamber type plasma CVD apparatus.

FIG. 21 shows its schematic diagram. As seen in the figure, a substrate loading chamber 121, a first reaction chamber 122, a second reaction chamber 123 and a substrate unloading chamber 124 are successively connected by being parted by gate valves 125, 127 and 128. Gate valves 125 and 129 are provided respectively to the substrate loading chamber 121 and the substrate unloading chamber 124 to shield them from the outside.

Independent vacuum exhaust systems 130, 131, 132 and 133 are connected to each chambers 122, 123, 124 and 125, so that each chamber may be exhausted or maintained at a certain pressure and atmosphere. This exhaust system comprises, as the basic elements, a conductance valve 134 for adjusting discharge flow amount, stop valves 135 and 136, a turbo molecular pump 137 which can perform oil-free vacuum exhaustion and a water sealing pump 138 for low vacuum exhaustion. Beside them, a by-pass exhaust system or a plurality of exhaust systems may be provided as necessary.

Moreover, indenpendent gas supplying systems 140, 141, 142 and 143 are provided to each chamber and a plurality of supplying systems are provided for the reaction chambers 122 and 123 to be able to supply a reaction atmospheric gas and other gases. These gas supplying systems contain, as the basic elements, a flow amount controller 144 and a stop valve 145.

In addition to them, halogen lamp heating means are provided for the substrate loading chamber 121 and the reaction chambers 122 and 123 to heat a substrate in the present embodiment because the apparatus is a plasma CVD apparatus. The substrate heating means are provided at positions which cannot be shown by a section view of FIG. 21, i.e. on the planes at this side and the inside of the sheet of FIG. 21 and radiate light from the planes in the direction parallel to the substrate surface to heat the substrate. Beside those positions, the heating means may be provided on the planes on which the upper and lower electrodes are disposed and may be changed according to a need. Also the heating means may be changed variously to a resistance heating method or an induction heating method, beside the halogen lamp method.

Figure 22:
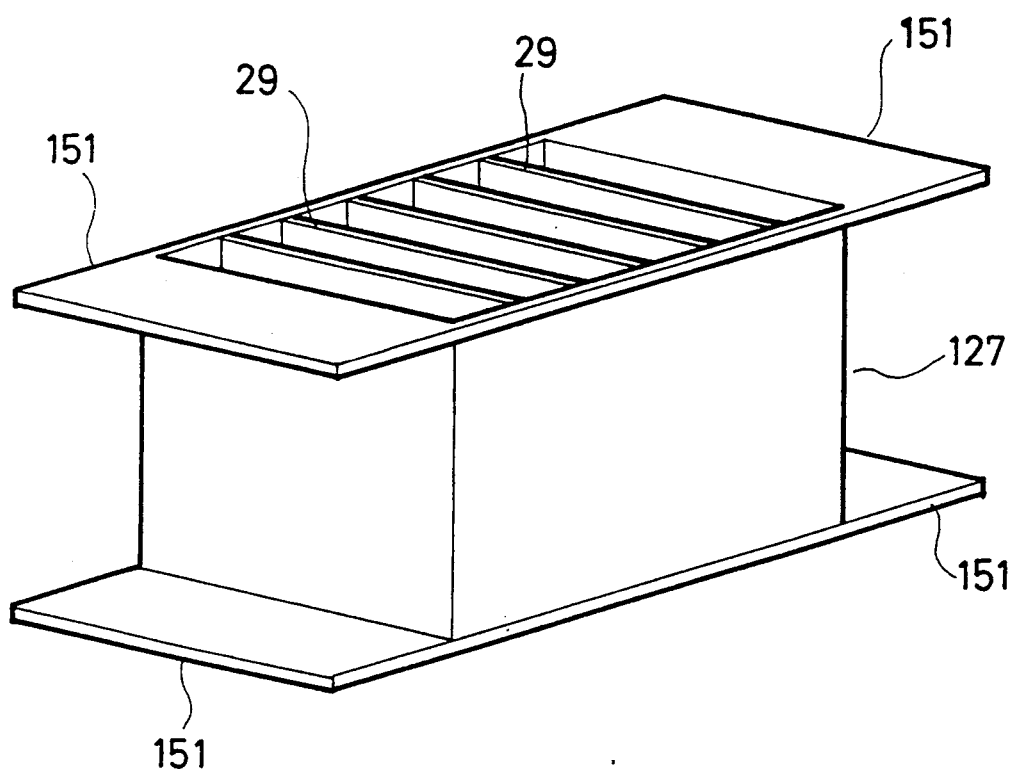
FIG. 22 is a schematic drawing illustrating one example of the container and susceptors of the present invention.
Figure 24:
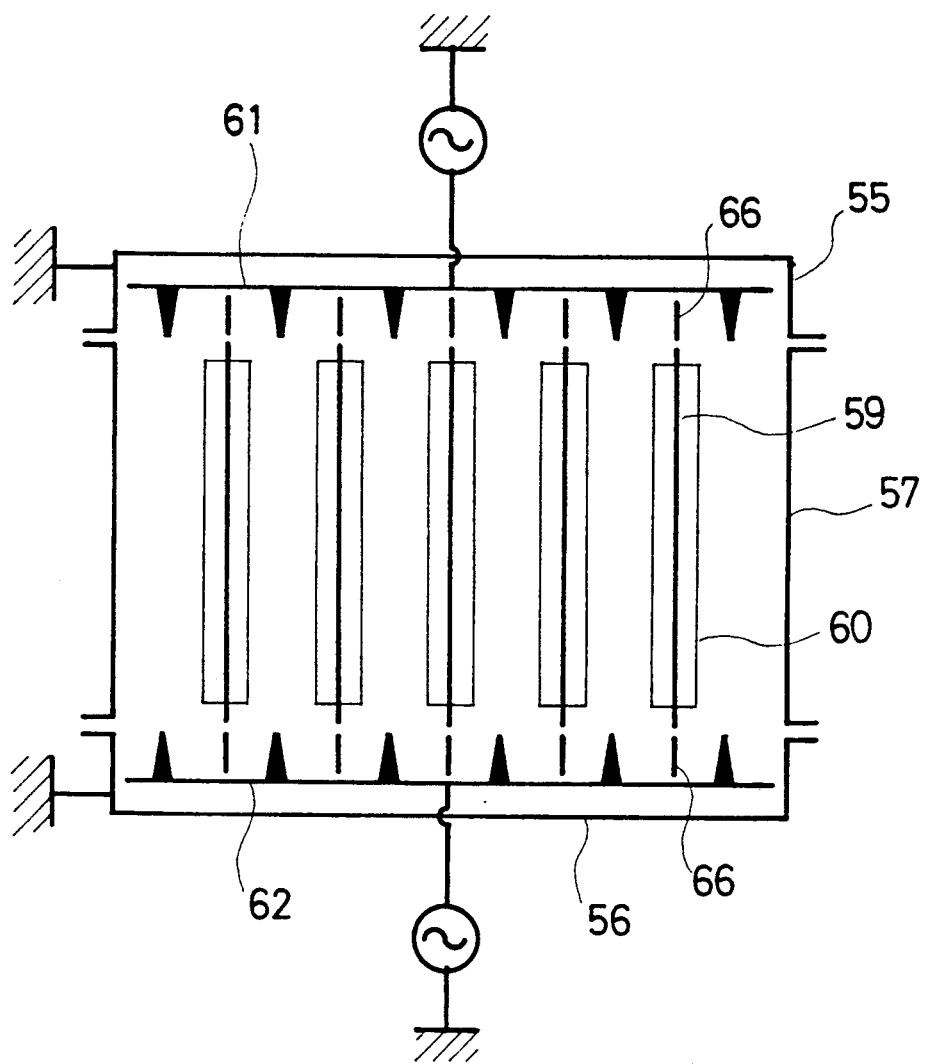
FIG. 24 is a schematic drawing illustrating a part around other discharge area of the plasma treatment apparatus of the present invention.

The susceptor structure around the discharge area in FIG. 5 is applied to the plasma CVD apparatus structured as described above. In the present embodiment, 10 sheets of glass substrates with a size of 600 mm × 800 mm × 1.1 mm whose surface has been polished are provided pinching the susceptor 29. FIG. 22 shows an appearance of the susceptors 29 and a container 27 containing the susceptors. As seen from the figure, in the present embodiment, surfaces other than a pair of surfaces of the peripheral surfaces of the container which are substrates set on the susceptors are all surrounded by the peripheral wall of the container.

In the present embodiment, the container and the susceptors are made of aluminum to keep potentials of such susceptors and the surface of the substrate in floating condition. Then the whole outer surface of the container and the susceptors are anodized to form alumina film uniformly in 1 to 15 μm of thickness (5 μm in the present embodiment) across the whole outer surface thereof. That is, all the members of the container and the susceptors are structured to have a cross section as shown in FIG. 6b. By the way, the substrate is heated in the present embodiment, so that the container and the susceptors thermally expand by the heat. Moreover, when the substrate is taken out after finishing its treatment, the container and the susceptors thermally contract. At this time, due to a difference of degrees of the expansion between an outer insulating film and inner metallic material, the outer insulating film is sometimes is broken or cracked. Due to that, in the case of the present invention, the breakage or crack of the outer insulating film is suppressed by thinly forming the film once less than a predetermined thickness and by forming the film again after treating by heat.

The minimum distance between the electrodes for discharge 31 and 32 and the container 27 or the susceptor 29 is set to be 3 to 10 mm (6 mm in the present embodiment). The volume of the apparatus has to be increased when this distance is more than 10 mm, so that the gap is narrowed down as much as possible. However, if it is too narrow, the container, the susceptors and the electrodes thermally expand and contact each other due to the heat for heating the substrate because the apparatus is a plasma CVD apparatus, so that about 3 mm of distance is necessary, though it depends on a size of the apparatus.

In the case of a plasma CVD apparatus in the present embodiment, a position relationship among the container 27, the susceptors 29, the electrodes 31 and 32 and the electrode shields 25 and 26 is such as shown in FIG. 23. That is, FIG. 23a is a schematic drawing illustration the position relationship seen from the same direction in FIGS. 5 and 31, and the electrode shields 25 and 26 and the container 27 have parts 150 and 151 which extend facing in the transverse direction at the end thereof whose distance is 2 to 5 mm (3 mm in the present embodiment). By doing like this, the container 27 may be moved in the transverse direction in the figure. FIG. 23b is a schematic drawing illustrating a cross section in the normal line direction of the plane in FIGS. 5 and 21. In this direction, only the ends of the electrode shields 25 and 26 overlap with the peripheral wall of the container 27 which is the part 150 extended in the vertical direction with a gap of 2 to 5 mm.

From such a relationship of the container 27 and the electrode shields 25 and 26, the container may be moved and plasma discharge may be confined only in the area surrounded by the electrode shields 25 and 26 and the peripheral wall of the container 27. Moreover, by extending the ends of the electrode shields in the vertical direction as shown in FIG. 23b, the volume of the apparatus may be reduced.

The substrates 30 set in the substrate loading chamber 121 by the container 27 are exhausted until ultimate vacuum of $2 \times 10^{-7}$ Torr in the chamber and then heated up to 300° C. and maintained in the temperature by the heating means. Then the gate valve 126 is opened almost under the same pressure condition with that of the first reaction chamber 122 and is closed after moving the container to the first reaction chamber 122. In the reaction chamber, a first thin film is formed under predetermined conditions and exhaustion is carried out again. Then the gate valve 127 is opened under the same pressure condition with that of the second reaction chamber to move the container to the second reaction chamber and to form a second thin film. Then again, exhaustion is carried out and the gate valve 128 is opened under the same pressure condition with that of the substrate unloading chamber 124 to move the container. Then in this chamber, the substrates are left for a while until the substrate temperature drops or cooling medium or cooled gas is introduced in the unloading chamber 124 to lower the substrate temperature. Then the pressure in the unloading chamber 124 is returned to atmospheric pressure and the gate valve 129 is opened to take out the substrates. Thin films are formed on many substrates by such a flow. Such an apparatus structure may be applied to formation of gate insulating films and semiconductor layers of thin film transistors and to fabrication of such electronic devices as solar batteries and diodes.

By structuring as described above, plasma discharge is caused by the pair of electrodes 31 and 32 by being confined in the plasma reaction area and almost all input power is supplied to the gas within the space without passing through the surface of the substrate and the susceptor; thus stable discharge and uniform plasma discharge may be realized. Accordingly, the coating films formed on the substrates by the apparatus of the present embodiment have an excellent uniformity in the thickness and within ±5% of uniformity could be achieved with a substrate having a size of 800 mm × 800 mm. Also ±10% of uniformity in the same lot (10 sheets in the present embodiment) could be achieved.

There are various methods for keeping the potential on the surface of the susceptors in floating condition as in the present embodiment. The simplest way to realize it is to fabricate the container and/or the susceptors by an insulating material such as quartz, though it is technologically impossible or becomes very expensive to make the container or the susceptors with the size of the substrate in the present embodiment by quartz and is not practical at all. Furthermore, if they are made from quartz, they become very brittle and are easily broken, so that the movement and setting of the container by means of robots become difficult and become an obstacle in designing automatic lines when unmanned operation is carried out in the future.

Moreover, when a metallic material is used for the container and/or the susceptors as in the present embodiment, an equality of heat is very good when the substrates are heated in especially plasma CVD and almost no difference is seen in a distribution of substrate temperature due to the difference of positions on the substrates and of positions of the substrates in the container. Accordingly, uniform heating across the whole substrate may be realized by heating from one or both end directions of the substrate as in the present embodiment, without heating the whole substrate upon uniforming temperature distribution of a heating means as in the prior art resistance heating. In addition to that, heating speed can be increased and plasma treatment time can be shortened.

FIFTH EMBODIMENT

A structure of a discharge area of this embodiment is almost the same with that of the fourth embodiment, and a container having a double frame structure as shown in FIG. 6a is adopted for its container.

That is, the container 39 is made from a nickel material and the outer frame 38 is provided at the outside of the container through the intermediary of the insulating materials. The container is supported in the reaction chamber by the outer frame 38. By doing like this, the susceptors inside thereof may be kept electrically in floating condition. Such structure allows to realize the floating condition of potential on the surface of the susceptors using the metallic material for the container, so that a simple structured, low cost and solid container may be realized.

For the insulating materials 37, glass, heat resistant rubber and organic resin may be used, though other materials may be used so long as it causes no degasification in the vacuum reaction chamber and has a heat resistance.

For comparison purpose, uniformity of thickness of silicon films formed under the film fabrication conditions as described in Table 2 using the apparatus structure of the present embodiment and the prior art apparatus structure (FIG. 2) were measured and its result is shown in Table 3. Since the susceptors are made from metal, their potential is connected to the earth and stability of discharge cannot be secured in the case of the prior art apparatus structure, metallic susceptors by which 6 substrates can be treated per one time of treatment which is 60% of the present embodiment were used.

outer wall of the container which contact with plasma, its path may be eliminated by replenishing it or by the concentration of the electric field and more uniform discharge can be realized in the individual discharge areas and in the whole apparatus.

For comparison purpose, uniformity of thickness of silicon films formed under the film fabrication conditions as described in Table 2 using the apparatus structure of the present embodiment and the prior art apparatus structure (FIG. 2) were measured and its result is shown in Table 4. Since the susceptors are made from metal, their potential is connected to the earth and stability of discharge cannot be secured in the case of the prior art apparatus structure, metallic susceptors by which 6 substrates can be treated per one time of treatment which is 60% of the present embodiment were used.

TABLE 4

| Batch No. | Distribution within Substrate $\frac{\text{Max. thick} - \text{Min. thick}}{2 \times \text{Av. thick}} \times 100\ (\pm\%)$ | | | | | | | | | | Average |
|---|---|---|---|---|---|---|---|---|---|---|---|
| PA |
| 1 | 10.1 | 9.2 | 8.5 | 8.6 | 9.5 | 10.2 | — | — | — | — | 9.35 |

TABLE 2

| | SiH4 Gas Flow Amount (SCCM) | Reaction Pressure (Torr) | High Frequency Power (W/cm$^2$) | Size of Substrate (mm) | Number of Substrates (1 batch) |
|---|---|---|---|---|---|
| PA. | 1000 | 0.001–1 | 0.01–2 | 600 × 800 × 1.1 | 8 |
| PI. | 1000 | 0.001–1 | 0.01–2 | 600 × 800 × 1.1 | 10 |

(PA: Prior Art,
PI: Present Invention)

TABLE 3

| Batch No. | Distribution within Substrate $\frac{\text{Max. thick} - \text{Min. thick}}{2 \times \text{Av. thick}} \times 100\ (\pm\%)$ | | | | | | | | | | Average |
|---|---|---|---|---|---|---|---|---|---|---|---|
| PA |
| 1 | 10.1 | 9.2 | 8.5 | 8.6 | 9.5 | 10.2 | — | — | — | — | 9.35 |
| 2 | 9.7 | 9.1 | 8.2 | 8.4 | 9.7 | 10.1 | — | — | — | — | 9.20 |
| 3 | 10.2 | 9.4 | 8.6 | 8.7 | 9.6 | 9.8 | — | — | — | — | 9.38 |
| 4 | 9.9 | 8.9 | 8.8 | 8.9 | 9.4 | 9.9 | — | — | — | — | 9.30 |
| 5 | 10.0 | 9.1 | 8.4 | 8.3 | 9.5 | 10.1 | — | — | — | — | 9.23 |
| PI |
| 1 | 5.0 | 5.0 | 4.0 | 4.0 | 4.0 | 3.0 | 4.0 | 5.0 | 4.0 | 3.0 | 4.10 |
| 2 | 5.0 | 4.7 | 4.1 | 4.2 | 4.1 | 3.3 | 4.1 | 4.7 | 3.8 | 3.5 | 4.15 |
| 3 | 4.5 | 4.8 | 3.8 | 3.7 | 4.0 | 3.2 | 3.8 | 4.8 | 3.9 | 3.4 | 3.99 |
| 4 | 4.8 | 4.5 | 3.9 | 3.8 | 3.9 | 3.4 | 3.7 | 5.1 | 4.1 | 3.2 | 4.04 |
| 5 | 4.9 | 4.7 | 4.2 | 4.1 | 3.9 | 3.1 | 4.0 | 4.9 | 4.0 | 3.1 | 4.09 |

(PA: Prior Art,
PI: Present Invention)

Thus, the present embodiment can increase the number of substrates to be treated in one time and can realize stable and uniform plasma discharge as compare to the prior art, so that a dispersion in degrees of treatment among substrates can be reduced.

SIXTH EMBODIMENT

A structure of a discharge area of this embodiment is almost the same with those in FIG. 23a and 23b, and as protrusions on the electrodes, what the distribution density of the needle-like protrusions 52 has been changed as shown in FIG. 8b is used.

That is, needles with 5 mm of length and 1 mm of diameter made from aluminum are provided by brazing on the plane electrodes made from aluminum so that the closer to the electrode 48, the more dense the needles are. By providing the needles like this, even if power leaks at parts on the surface of the susceptors and on the

TABLE 4 (continued)

| Batch No. | | | | | | | | | | | Average |
|---|---|---|---|---|---|---|---|---|---|---|---|
| 2 | 9.7 | 9.1 | 8.2 | 8.4 | 9.7 | 10.1 | — | — | — | — | 9.20 |
| 3 | 10.2 | 9.4 | 8.6 | 8.7 | 9.6 | 9.8 | — | — | — | — | 9.38 |
| 4 | 9.9 | 8.9 | 8.8 | 8.9 | 9.4 | 9.9 | — | — | — | — | 9.30 |
| 5 | 10.0 | 9.1 | 8.4 | 8.3 | 9.5 | 10.1 | — | — | — | — | 9.23 |
| PI |
| 1 | 5.1 | 4.0 | 4.2 | 4.2 | 4.5 | 2.8 | 4.0 | 4.5 | 4.0 | 3.0 | 4.03 |
| 2 | 5.0 | 4.0 | 4.2 | 4.0 | 4.1 | 3.5 | 4.1 | 4.2 | 3.8 | 3.0 | 4.05 |
| 3 | 4.5 | 4.8 | 3.8 | 3.7 | 4.0 | 3.2 | 4.2 | 4.8 | 3.1 | 3.8 | 3.99 |
| 4 | 4.2 | 4.5 | 4.2 | 3.8 | 3.9 | 3.4 | 3.3 | 4.5 | 4.1 | 3.5 | 3.97 |
| 5 | 4.5 | 4.4 | 4.3 | 4.1 | 3.6 | 3.1 | 3.7 | 4.2 | 4.5 | 3.3 | 3.97 |

(PA: Prior Art,
PI: Present Invention)

Thus, the present embodiment can increase the number of substrates to be treated in one time and can realize stable and uniform plasma discharge as compare to the prior art, so that a dispersion in degrees of treatment among substrates can be reduced.

In the present embodiment above, although the potential of the container around the discharge area and of the susceptors was not specifically defined, it is desirable to keep the potential on the surface of the susceptors in floating condition by forming insulating films at least on the surface of the container or the susceptors if stability and uniformity of discharge are to be sought.

In addition to that, it is also possible to make the outside of the container into a double structure to support the container by a part thereof and to insulate the susceptors inside from the outside reaction chamber to keep the potential on the surface of the susceptors in floating condition.

SEVENTH EMBODIMENT

A structure of a discharge area of this embodiment is almost the same with that shown in FIG. 10, and a structure of the discharge area as shown in FIGS. 11 and 12 in which auxiliary susceptors are provided to all the substrate susceptors is adopted.

That is, the auxiliary susceptors 66 and 68 are provided on the positions which structure almost the same plane with the substrate susceptors and the plasma discharge area is surrounded by the electrode shields 55 and 56, the container and the auxiliary shields 67.

This discharge area is apparently divided into individual discharge areas by the substrate susceptors. The electric field is concentrated by the protrusion in the divided individual discharge area. Thereby uniform plasma discharge can be realized and even if power leaks at parts on the surface of wall which contacts with the plasma, its path may be eliminated by replenishing it or by the concentration of the electric field. Accordingly, more uniform discharge can be realized in the individual discharge areas and in the whole apparatus.

For comparison purpose, uniformity of thickness of silicon films formed under the film fabrication conditions as described in Table 2 using the apparatus structure of the present embodiment and the prior art apparatus structure (FIG. 2) were measured and its result is shown in Table 5. Since the susceptors are made from metal, their potential is connected to the earth and stability of discharge cannot be secured in the case of the prior art apparatus structure, metallic susceptors by which 6 substrates can be treated per one time of treatment which is 60% of the present embodiment were used.

TABLE 5

| Batch No. | Distribution within Substrate $\frac{Max.\ thick - Min.\ thick}{2 \times Av.\ thick} \times 100\ (\pm\%)$ | | | | | | | | | | Average |
|---|---|---|---|---|---|---|---|---|---|---|---|
| PA | | | | | | | | | | | |
| 1 | 10.1 | 9.2 | 8.5 | 8.6 | 9.5 | 10.2 | — | — | — | — | 9.35 |
| 2 | 9.7 | 9.1 | 8.2 | 8.4 | 9.7 | 10.1 | — | — | — | — | 9.20 |
| 3 | 10.2 | 9.4 | 8.6 | 8.7 | 9.6 | 9.8 | — | — | — | — | 9.38 |
| 4 | 9.9 | 8.9 | 8.8 | 8.9 | 9.4 | 9.9 | — | — | — | — | 9.30 |
| 5 | 10.0 | 9.1 | 8.4 | 8.3 | 9.5 | 10.1 | — | — | — | — | 9.23 |
| PI | | | | | | | | | | | |
| 1 | 3.9 | 2.1 | 3.9 | 3.1 | 2.9 | 3.7 | 3.0 | 3.2 | 3.0 | 2.1 | 3.09 |
| 2 | 3.9 | 3.7 | 3.2 | 3.1 | 2.9 | 2.1 | 3.0 | 3.9 | 3.0 | 2.5 | 3.09 |
| 3 | 4.3 | 4.0 | 3.0 | 3.0 | 2.7 | 2.5 | 3.0 | 4.0 | 3.0 | 2.5 | 3.20 |
| 4* | 4.0 | 4.0 | 3.0 | 3.0 | 3.0 | 2.0 | 3.0 | 4.0 | 3.0 | 2.0 | 3.10 |
| 5 | 4.0 | 3.7 | 3.2 | 3.1 | 3.1 | 2.3 | 3.1 | 3.7 | 2.6 | 3.8 | 3.15 |

(PA: Prior Art.
PI: Present Invention)

Thus, the present embodiment can increase the number of substrates to be treated in one time and can realize stable and uniform plasma discharge as compare to the prior art, so that a dispersion in degrees of treatment among substrates can be reduced.

In the present embodiment above, although the potential of the container around the discharge area and of the susceptors was not specifically defined, it is desirable to keep the potential on the surface of the susceptors in floating condition by forming insulating films at least on the surface of the container or the susceptors if stability and uniformity of discharge are to be sought.

In addition to that, it is also possible to make the outside of the container into a double structure to support the container by a part thereof and to insulate the susceptors inside from the outside reaction chamber to keep the potential on the surface of the susceptors in floating condition.

Accordingly, the present invention structured as described above allows to realize the plasma treatment apparatus that can treat a large number of substrates having a large area in very compact apparatus area and apparatus volume. Moreover, the present invention allows to uniform the degree of plasma treatment on the substrates having a large area, so that production yield can be increased very much if it is applied to production of thin film transistors of switching elements of a liquid crystal display.

Moreover, since the container is low in its price and is solid, the present invention has such a secondary effect that such a problem as breakage of the container needs not be taken into account when an automated line by means of robots is designed.

In addition to that, the present invention allows to control a stability of discharge by differences of substrate installing intervals by changing shape, position and size of the parts which cause the concentration of electric field.

It is also appreciated that the degree of the concentration of electric field may be changed just by changing the distribution density of the protrusions on the electrodes and that thereby more stable plasma discharge may be realized.

Furthermore, the plasma gaseous reaction apparatus of the present invention comprises a reaction chamber, a system for supplying reaction gas to the reaction chamber and a exhaust system for exhausting unnecessary reaction products has a structure in which a pair of facing electrodes disposed in the reaction chamber are covered by shields except of an area in which the electrodes face each other, the shields has a double structure consisted of an inner first shield electrically insulated from the electrodes and an outer second shield which is kept in earth potential, a substrate container for supporting substrates has a structure of surrounding the substrates by a frame except of the area in which the electrodes face, the outside of the substrate container is kept in the earth potential and is covered by a conductor plate electrically insulated from the substrate container and the pair of shields and the substrate container are provided so that plasma generated by electric power supplied from the pair of electrodes is confined in a space surrounded by the pair of shields and the substrate container, so that plasma potential within the plasma and potential of the substrate become small and thereby sputtering on the substrate is eliminated and coating films are not damaged. In the same time, since insulators are inserted between the substrate container and the conductor plate, the temperature retaining effect of the substrate container may be improved and the substrate heating efficiency may be improved.

Then the plasma gaseous reaction apparatus comprising the reaction chamber, the system for supplying the reaction gas to the reaction chamber and the exhaust system for exhausting the unnecessary reaction products has the structure in which a pair of facing electrodes disposed in the reaction chamber are covered by shields except of an area in which the electrodes face each other, the substrate container containing the susceptors for supporting the substrates has a structure of surrounding the substrates by the frame except the area in which the electrodes face each other and the insulated plate is provided in the shields in a manner in which its surface corresponds to the surface to be formed of the substrate, so that the coating film may be uniformed.

What is claimed is:

1. A plasma gaseous reaction apparatus comprising a reaction chamber, a system for supplying reaction gas to said reaction chamber and a exhaust system for discharging unnecessary reaction products, said apparatus being characterized in that in which a pair of facing electrodes disposed in said reaction chamber are covered by shields except of an area in which said electrodes face each other, said shields has a double structure consisted of an inner first shield electrically insulated from said electrodes and an outer second shield which is kept in earth potential, a substrate support for supporting substrates has a structure of surrounding said substrates by a frame except of said area in which said electrodes face, the outside of said substrate support is kept in the earth potential and is covered by a conductor plate electrically insulated from said substrate susceptor and said pair of shields and said substrate support are provided so that plasma generated by electric power supplied from said pair of electrodes is confined in a space surrounded by said pair of shields and said substrate support.

2. A plasma gaseous reaction apparatus comprising a reaction chamber, a system for supplying reaction gas to said reaction chamber and an exhaust system for discharging unnecessary reaction gas or products, said apparatus comprising a pair of facing electrodes disposed in said reaction chamber, said pair of facing electrodes being covered by shields except for an area in which said electrodes face each other, said shields having a double structure comprising an inner first shield electrically insulated from said electrodes and an outer second shield which is kept in earth potential so that plasma generated by electric power supplied from said pair of electrodes is confined in a space defined by said pair of shields.

3. The apparatus of claim 2 wherein said plasma does not extend outside said space defined by said pair of shields.

4. A plasma gaseous reaction apparatus comprising a reaction chamber, a system for supplying reaction gas to said reaction chamber and an exhaust system for discharging unnecessary reaction gas or products, said apparatus comprising a pair of facing electrodes disposed in said reaction chamber, said electrodes being covered by shield means except for an area in which said electrodes face each other, said shield means comprising a plurality of shields, an innermost one of said plurality of shields having a floating potential, an outermost one of said plurality of shields having a ground potential, so that plasma generated by electric power supplied by said pair of electrodes is confined in a space defined by said shield means.

5. A plasma treatment method carried out in a plasma gaseous reaction apparatus comprising a reaction chamber, a system for supplying reaction gas to said reaction chamber and an exhaust system for discharging unnecessary reaction gas or products, said apparatus comprising a pair of facing electrodes positioned in said reaction chamber, said electrodes being covered by shield except for an area in which said electrodes face each other, and said shields having a double structure comprising an inner first shield electrically insulated from said electrodes and an outer second shield which is kept in earth potential, a substrate for supporting substrates having a structure which surrounds said substrates by a frame except for said area in which said electrodes face wherein an outside of said substrate support is kept in earth potential and is covered by a conductor plate electrically insulated from said substrate susceptor, said method comprising;
  providing a substrate on said substrate support;
  introducing said reaction gas into said apparatus; and
  supplying said electric power from said pair of electrodes to generate plasma so that said plasma is confined in a space surrounded by said pair of shields and said substrate support.

6. A plasma treatment method carried out in a plasma gaseous reaction apparatus comprising a reaction chamber, a system for supplying reaction gas to said reaction chamber and an exhaust system for discharging unnecessary reaction gas or products, said apparatus comprising a pair of facing electrodes disposed in said reaction chamber, said electrodes being covered by shields except for an area in which said electrodes face each other and said shields having a double structure comprising an inner first shield electrically insulated from said electrodes and an outer second shield which is kept in earth potential so that plasma generated by electric power supplied from said pair of electrodes is confined in a space defined by said pair of shields, said method comprising:
  introducing said reaction gas into said apparatus; and
  supplying said electric power from said pair of electrodes to generate plasma between said electrodes.

7. A plasma treatment method carried out in a plasma gaseous reaction apparatus comprising a reaction chamber, a system for supplying reaction gas to said reaction chamber and an exhaust system for discharging unnecessary reaction gas or products, said apparatus comprising a pair of facing electrodes disposed in said reaction chamber, said electrodes being covered by shield means except for an area in which said electrodes face each other; said shield means comprising a plurality of shields wherein an innermost one of said shields has a floating potential and an outermost one of said shields has a ground potential, so that plasma generated by electric power supplied from said pair of electrodes is confined in a space defined by said shield means, said method comprising:
  introducing said reaction gas of said pair of electrodes; and
  supplying said electric power from said pair of electrodes to generate plasma between said electrodes.

* * * * *